US012650459B2

(12) United States Patent
Chakravarty et al.

(10) Patent No.: US 12,650,459 B2
(45) Date of Patent: Jun. 9, 2026

(54) TEST AND REPAIR OF INTERCONNECTS BETWEEN CHIPS

(71) Applicant: Intel Corporation, Santa Clara, CA (US)

(72) Inventors: Sreejit Chakravarty, San Jose, CA (US); Adithya Kashyap, Mysuru (IN); Vijaya Chelli, Daggubadu (IN); Micha Shahar, Petah Tikva (IL); Rakesh Kandula, Bangalore (IN); Dovev Amosi, Natanya (IL)

(73) Assignee: Intel Corporation, Santa Clara, CA (US)

( * ) Notice: Subject to any disclaimer, the term of this patent is extended or adjusted under 35 U.S.C. 154(b) by 77 days.

(21) Appl. No.: 17/871,807

(22) Filed: Jul. 22, 2022

(65) Prior Publication Data

US 2024/0027516 A1     Jan. 25, 2024

(51) Int. Cl.
G01R 31/28          (2006.01)
G01R 31/317          (2006.01)

(52) U.S. Cl.
CPC ..... G01R 31/2812 (2013.01); G01R 31/2853 (2013.01); G01R 31/31717 (2013.01)

(58) Field of Classification Search
None
See application file for complete search history.

(56) References Cited

U.S. PATENT DOCUMENTS

| | | |
|---|---|---|
| 6,067,262 A | 5/2000 | Irrinki et al. |
| 2011/0121815 A1 | 5/2011 | Yamamoto et al. |

| | | | |
|---|---|---|---|
| 2012/0248438 A1 | 10/2012 | Lung et al. | |
| 2013/0021079 A1 | 1/2013 | Jeong | |
| 2014/0015583 A1* | 1/2014 | Goel .............. | G01R 31/318513 327/261 |
| 2015/0061721 A1 | 3/2015 | Jeong | |
| 2020/0103456 A1 | 4/2020 | Terayama et al. | |
| 2020/0286798 A1 | 9/2020 | Choi | |
| 2021/0193623 A1* | 6/2021 | Oh ........................ | G11C 29/025 |
| 2025/0004046 A1* | 1/2025 | Kandula ............. | G01R 31/2896 |
| 2025/0052809 A1* | 2/2025 | Su ........................ | G01R 31/2889 |
| 2025/0068529 A1* | 2/2025 | Chakravarty ....... | G06F 11/2242 |

OTHER PUBLICATIONS

Extended European Search Report issued Dec. 8, 2023 for EP Application No. 23166314.7, 15 pages.
Intention to Grant issued Jan. 8, 2026 for EP Application No. 23166314.7, 9 pages.

* cited by examiner

*Primary Examiner* — Jermele M Hollington
(74) *Attorney, Agent, or Firm* — Schwabe, Williamson & Wyatt, P.C.

(57)          ABSTRACT

Embodiments herein relate to a test, repair, and diagnostic solution for chip-to-chip interconnects. In one aspect, on a first chip, a first finite state machine (FSM) is coupled to a set of transmit lanes. To test each transmit lane, one at a time, the first FSM is to apply a first periodic signal to a transmit lane under test and concurrently apply a second periodic signal to other transmit lanes of the set of transmit lanes, where a phase of the first periodic signal is opposite to a phase of the second periodic signal. A comparator compares a detected signal on the lane under test to an expected response. The comparator can be on the first chip, when the first chip is tested alone, or on a second chip, where the two chips are tested together.

17 Claims, 12 Drawing Sheets

Tx cluster　112a

Tx cluster　112a

Tx cluster　112a

Tx cluster 112a 310  311  312  313  314  315        316

305
315

320  321  322  323  324  325        326

Rx cluster 112b

Tx
410

Rx
430

Die2

415                    435

Rx
420

Tx
440

Die1

Rx
530

Tx
540

Die3

532                    542

533                    543

Tx
510

Rx
520

Die2

512      522      534                544

Rx
515

Tx
525

Tx
535

Rx
545

Die1

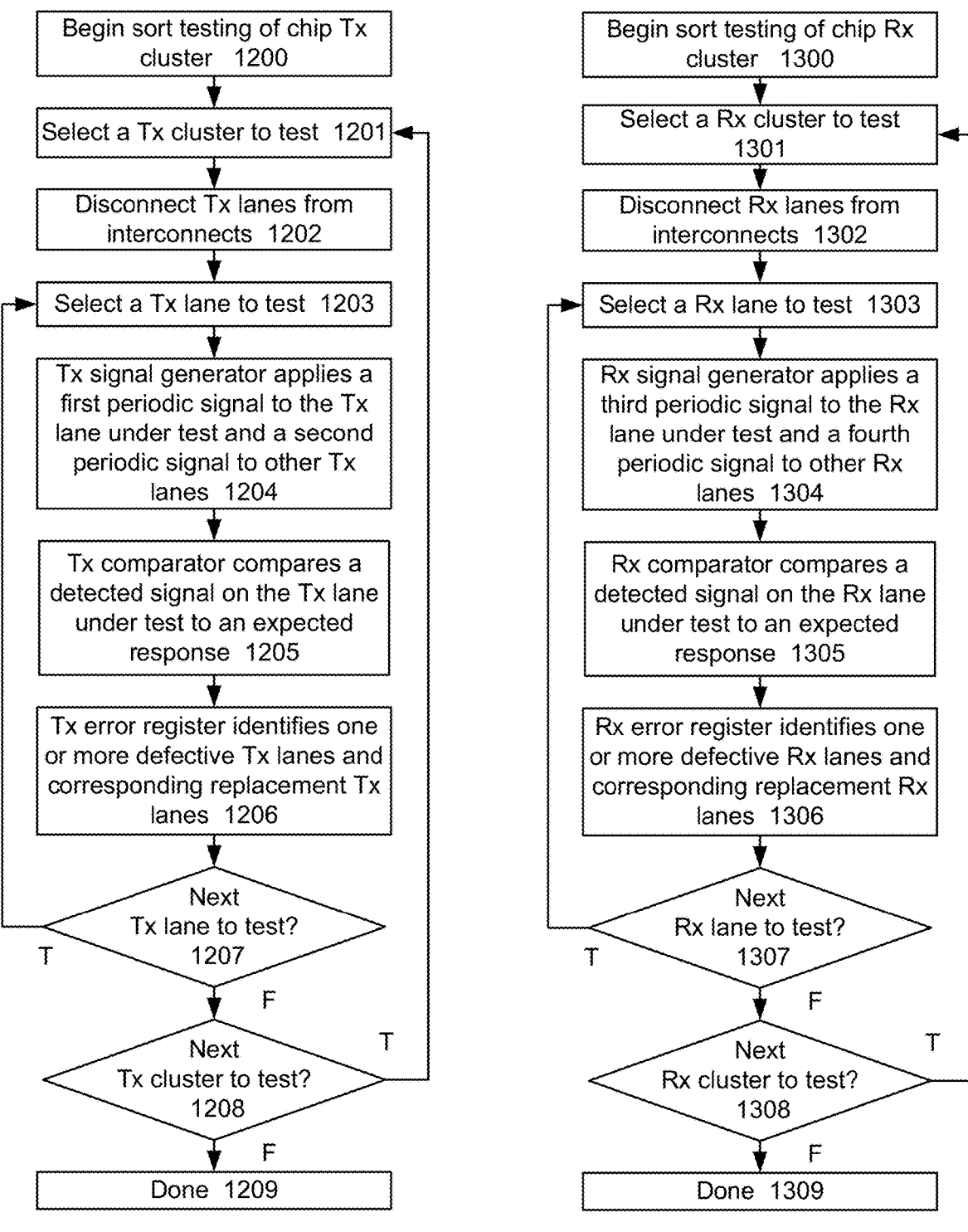

Begin sort testing of chip Tx cluster   1200

Select a Tx cluster to test   1201

Disconnect Tx lanes from interconnects   1202

Select a Tx lane to test   1203

Tx signal generator applies a first periodic signal to the Tx lane under test and a second periodic signal to other Tx lanes   1204

Tx comparator compares a detected signal on the Tx lane under test to an expected response   1205

Tx error register identifies one or more defective Tx lanes and corresponding replacement Tx lanes   1206

Next Tx lane to test?   1207

T       F

Next Tx cluster to test?   1208

T

F

Done   1209

Fig. 12

Begin sort testing of chip Rx cluster   1300

Select a Rx cluster to test   1301

Disconnect Rx lanes from interconnects   1302

Select a Rx lane to test   1303

Rx signal generator applies a third periodic signal to the Rx lane under test and a fourth periodic signal to other Rx lanes   1304

Rx comparator compares a detected signal on the Rx lane under test to an expected response   1305

Rx error register identifies one or more defective Rx lanes and corresponding replacement Rx lanes   1306

Next Rx lane to test?   1307

T       F

Next Rx cluster to test?   1308

T

F

Done   1309

Fig. 13

TEST AND REPAIR OF INTERCONNECTS BETWEEN CHIPS

FIELD

The present application generally relates to the field of semiconductor chips and more particularly, to testing interconnects between chips.

BACKGROUND

Various benefits including reduced power consumption and reduced form factor size can be achieved by integrating multiple semiconductor dice into a single package. The individual die are sometimes referred to as chiplets or compute tiles. For example, a processor can be built with compute tiles stacked vertically or side-by-side. However, various challenges are presented in testing such devices to ensure proper operation.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 12 depicts a flowchart of an example process for performing sort testing of a chip Tx cluster, in accordance with various embodiments.

FIG. 13 depicts a flowchart of an example process for performing sort testing of a chip Rx cluster, in accordance with various embodiments.

DETAILED DESCRIPTION

As mentioned at the outset, various challenges are presented in testing semiconductor dice. In some cases, the dice are connected using micro bumps. Micro bumps are protrusions on the surface of a die which can be coupled to corresponding micro bumps on an adjacent dice to allow signals to pass between the two dice. The protrusions are made of a conductive material such as copper. Micro bumps can be part of a sophisticated die-to-die interconnect technology for use in packaging multiple dice which may be fabricated using different process technologies. However, various defects can occur which prevent the die-to-die signals from being passed.

The techniques herein address the above and other issues.

In one aspect, a test, repair, and diagnostic solution is provided for die-to-die interconnects.

In another aspect, a built-in self-test solution is provided for such interconnects.

The techniques support interconnect repair using redundant lanes to improve yield, which is important to improving profitability.

The techniques support on-die repair calculation for yield improvement. This is important to reduce high volume manufacturing (HVM) test cost.

The techniques are not limited in the kind of manufacturing defects, observed in silicon, that it can target.

The techniques support cross-die clock tuning in silicon.

The techniques support test support in customer system.

The techniques support interconnect test and repair in customer systems to improve availability.

This built-in self-test solution includes a test stimulus generator that targets interconnect manufacturing defects and other failure modes, e.g., coupling faults, observed in silicon.

The solution provides a number of advantages. For example, it provides a capability to target interconnect manufacturing defects observed in silicon, to resolve the high-volume manufacturing (HVM) test quality gap of previous solutions, thereby improving outgoing product quality.

A feature to test, repair and calculate the repair signature on-die provides a repair capability which leads to a significant yield improvement.

Features supporting debug failure analysis help in process learning and process improvement which ultimately contribute to a more robust manufacturing flow for such interconnects.

System test is a feature that can be used to improve system assembly and manufacturing flow. Infield test and repair capability helps improve system availability.

The solution described can be added to each die in a multi-die package.

These and other features will be apparent in view of the following discussion.

Figure 1:
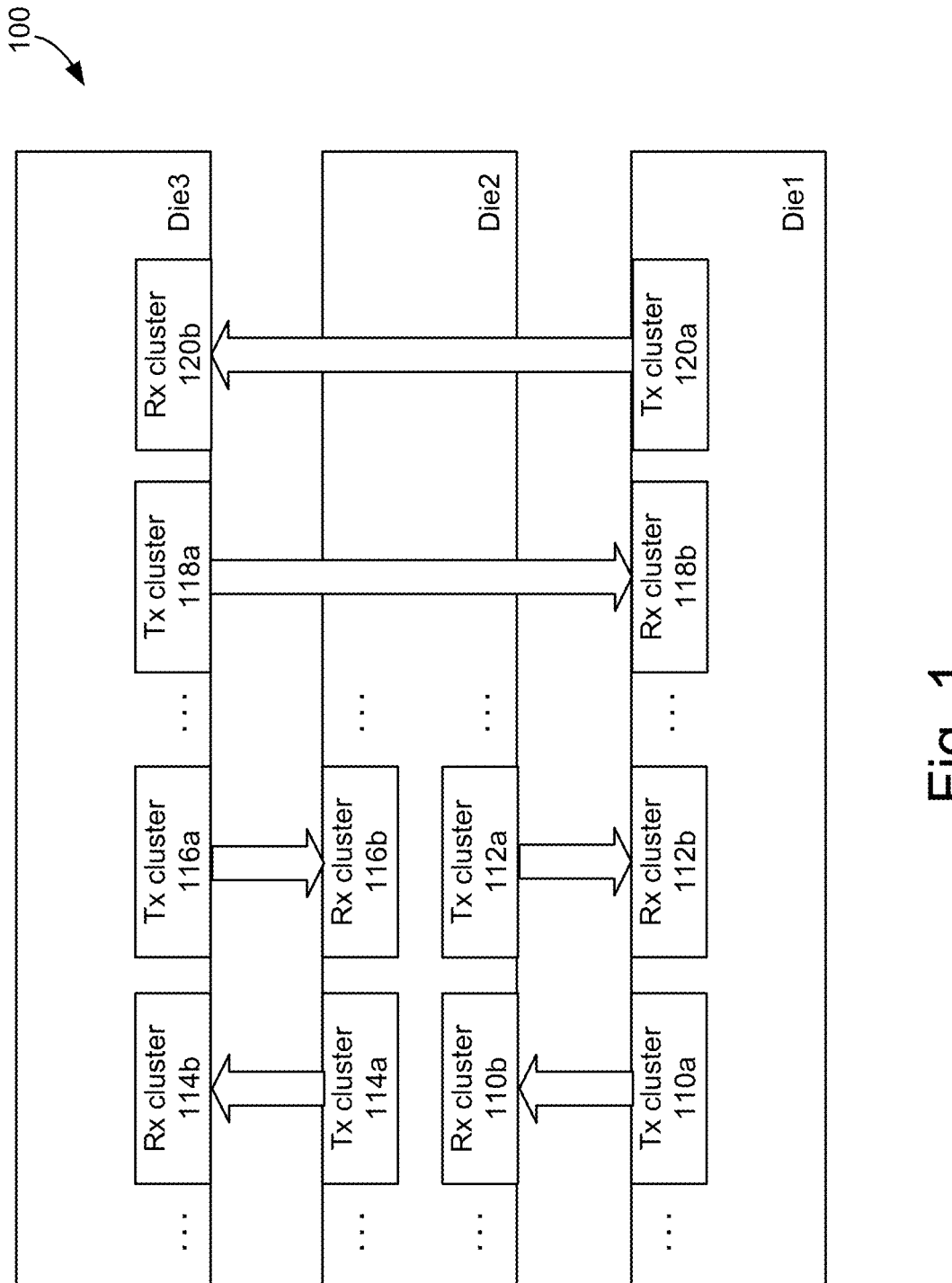
FIG. 1 depicts an example arrangement of transmit and receive clusters of signal paths between chips, in accordance with various embodiments.

FIG. 1 depicts an example arrangement of transmit and receive clusters of signal paths between chips, in accordance with various embodiments. An example multi-die package 100 includes three chips or die: Die1, Die2 and Die3. The die may be arranged vertically, one atop the other, for example. In some cases, a lower die, or base die, include input/output (I/O), memory and other logic functions and a higher die is a computer die which can include a processor core and graphics processors. Moreover, the different die may be built and developed using different technologies.

In another option, the die are arranged laterally on a substrate, side by side rather than vertically on top of one another. However, the techniques provided herein are particularly suitable for vertically arranged die due to the greater density of interconnects and the types of defects which occur especially in the vertical configuration.

During packaging, interconnects between Die1 and Die2, Die2 and Die3, and Die1 and Die3 may be formed to create the complete packaged product. Many unidirectional signals run between pairs of die. For each signal, there is a transmit (Tx) end in one die and a receive (Rx) end in another die. Moreover, while designing these interconnects, the large number of signals are divided into clusters. A Tx cluster on one die transmits signals to a corresponding Rx cluster on another die. Cluster sizes of 36, 48 and 64 signals can be used, for instance. Moreover, there could be multiple clock lanes in a cluster if clock repair is implemented.

For example, a Tx cluster 110a on Die1 transmits signals to an Rx cluster 110b on Die2. A cluster can refer to a set of paths and associated circuitry for communicating on the paths. A Tx cluster 112a on Die2 transmits signals to an Rx cluster 112b on Die1. A Tx cluster 114a on Die2 transmits signals to an Rx cluster 114b on Die3. A Tx cluster 116a on Die3 transmits signals to an Rx cluster 116b on Die2. In the above examples, the communicating die are adjacent to one another. In another example, the communicating die are non-adjacent and are separated by one or more intermediate die. For example, a Tx cluster 118a on Die3 transmits signals to an Rx cluster 118b on Die1 via Die2, and a Tx cluster 120a on Die1 transmits signals to an Rx cluster 120b on Die3 via Die2.

Figure 2A:
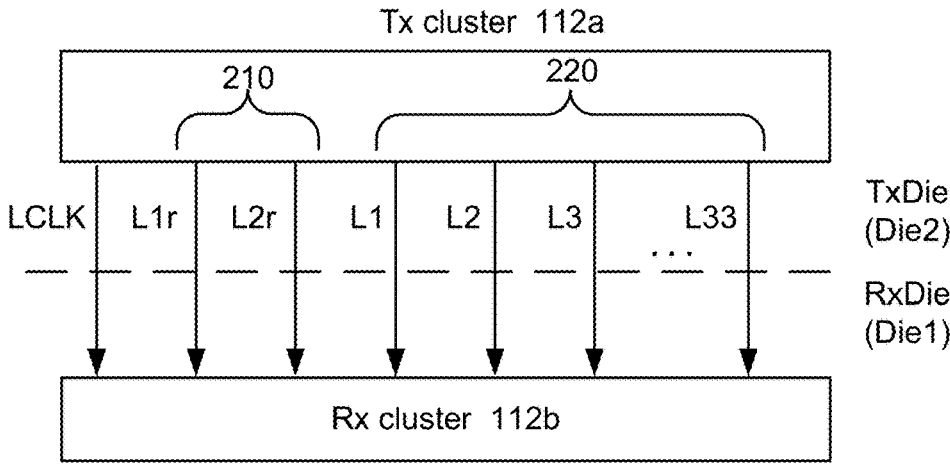
FIG. 2A depicts an example of signal paths between a transmit cluster in a transmit (Tx) die and a receive cluster in a receive (Rx) die, consistent with FIG. 1, and in accordance with various embodiments.

FIG. 2A depicts an example of signal paths between a transmit cluster in a transmit (Tx) die and a receive cluster in a receive (Rx) die, consistent with FIG. 1, and in accordance with various embodiments. Each cluster includes a set of transmit or receive paths or lanes for communicating functional signals between dice. Each cluster can also include one or more redundant lanes, and a clock lane. The number of functional signals can vary. The Tx cluster 112a and Rx cluster 112b of FIG. 1 are depicted as an example. As mentioned, a cluster can have 36, 48 or 64 lanes, for instance. For example, there are 36 lanes here. LCLK is a lane used for a clock signal, L1r and L2r are redundant lanes in a set 210 of one or more redundant lanes, and L1-L33 are normal lanes in a set of normal lanes 220. A normal lane is a default lane in which a signal is carried in the absence of a defect. A redundant lane can be assigned as a replacement lane for a default lane which is found to be defective/faulty.

Figure 2B:
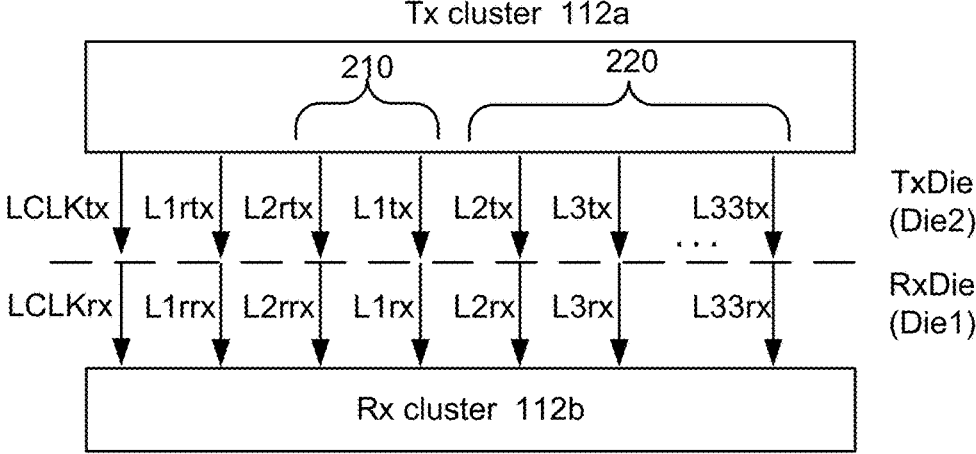
FIG. 2B depicts another view of the signal paths of FIG. 2A, in accordance with various embodiments.

FIG. 2B depicts another view of the signal paths of FIG. 2A, in accordance with various embodiments. Each path or lane can includes a portion in the Tx cluster and a corresponding portion in the Rx cluster. For example, LCLK includes LCLKtx in the Tx cluster and LCLKrx in the Rx cluster. L1r includes L1rtx in the Tx cluster and L1rrx in the Rx cluster. L2r includes L2rtx in the Tx cluster and L2rrx in the Rx cluster. L1-L33 include L1tx-L33tx, respectively, in the Tx cluster and L1rx-L33rx, respectively, in the Rx cluster.

Figure 2C:
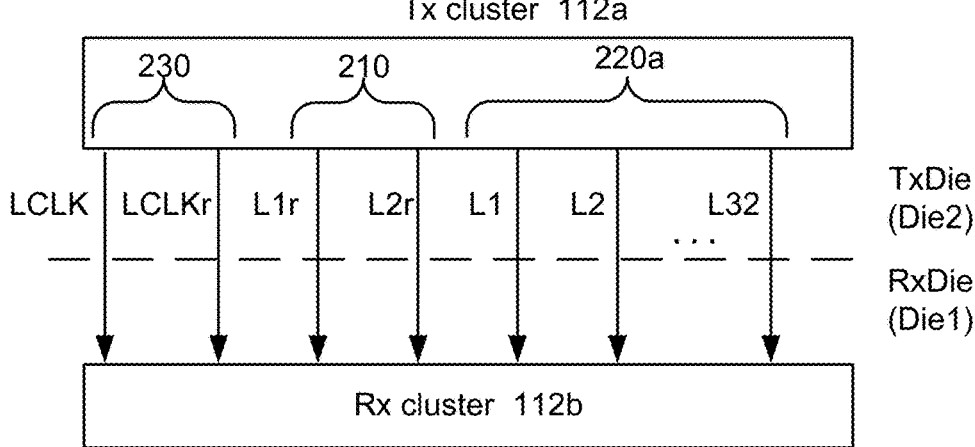
FIG. 2C depicts another example of signal paths between a transmit cluster in a transmit (Tx) die and a receive cluster in a receive (Rx) die, consistent with FIG. 1, where two clock lanes LCLK and LCLKr are provided, in accordance with various embodiments.

FIG. 2C depicts another example of signal paths between a transmit cluster in a transmit (Tx) die and a receive cluster in a receive (Rx) die, consistent with FIG. 1, where two clock lanes LCLK and LCLKr are provided, in accordance with various embodiments. In this case, two of the 36 lanes are used for a clock signal. In particular, a set 230 of lanes include a first, normal or default clock lane LCLK and a second redundant clock lane LCLKr. A common clock signal is provided on both clock lanes, and the clock signal on LCLKr can be used as a replacement for the clock signal on LCLK if testing indicates LCLK is defective. See also FIG. 11 for further details. This approach is different than the use of the redundant lanes since the clock signal is provided on both clock lanes even when there is no defect. This avoids the complexity of assigning a replacement lane for the clock signal and ensures that the clock signal is constantly available.

The redundant lanes L12 and L2r for functional signals between the dice are provided as before, along with lanes L1-L32 in a set 220a of lanes, where 32 default lanes instead of 33 are available due to the use of the extra clock lane.

Figure 3:
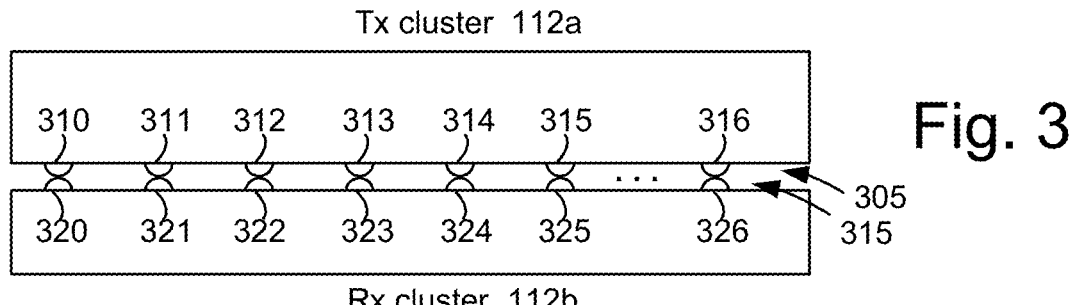
FIG. 3 depicts an example of micro bump interconnects of the Tx and Rx dice of FIG. 3, in accordance with various embodiments.

FIG. 3 depicts an example of micro bump interconnects of the Tx and Rx dice of FIG. 3, in accordance with various embodiments. The Tx cluster and the Rx cluster each include a set of micro bumps corresponding to the number of lanes. The micro bumps are depicted as being in a single row in this simplified example but in practice could be arranged in multiple rows in a two-dimensional grid on a top or bottom surface of a chip. For example, the Tx cluster 112a includes a set 305 of micro bumps 310-316 and the Rx cluster 112b includes a set 315 of micro bumps 320-326 which are connected to, e.g., touching, micro bumps 310-316, respectively. In one possible implementation, copper micro bumps are spaced apart at a 401 μm pitch, with a 20-25 μm bump size and a spacing of 151 μm spacing between adjacent bumps on the die. The micro bumps can be used to connect the metal layers in two adjacent dice.

Figure 4:
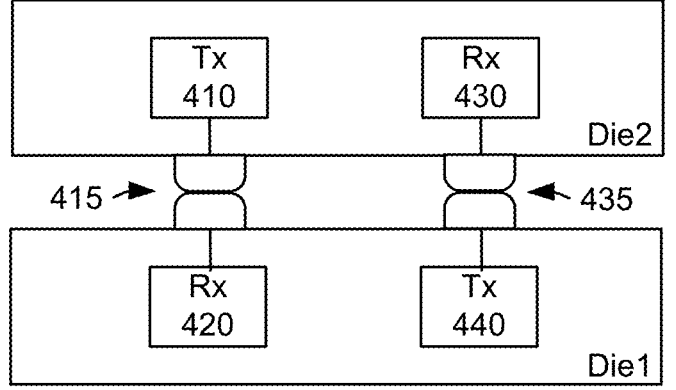
FIG. 4 depicts an example of paths between Tx and Rx functions of adjacent dice, consistent with FIG. 1, and in accordance with various embodiments.

FIG. 4 depicts an example of paths between Tx and Rx functions of adjacent dice, consistent with FIG. 1, and in accordance with various embodiments. Each micro bump provides an interconnect to the adjacent die, where the interconnect can be modelled as a pair of Tx and Rx circuits and the associated pair of micro bumps. For example, a Tx circuit 410 in Die2 can transmit signals to an Rx circuit 420 in Die1 via a pair of micro bumps 415. A Tx circuit 440 in Die1 can transmit signals to an Rx circuit 430 in Die2 via a pair of micro bumps 435.

Figure 5:
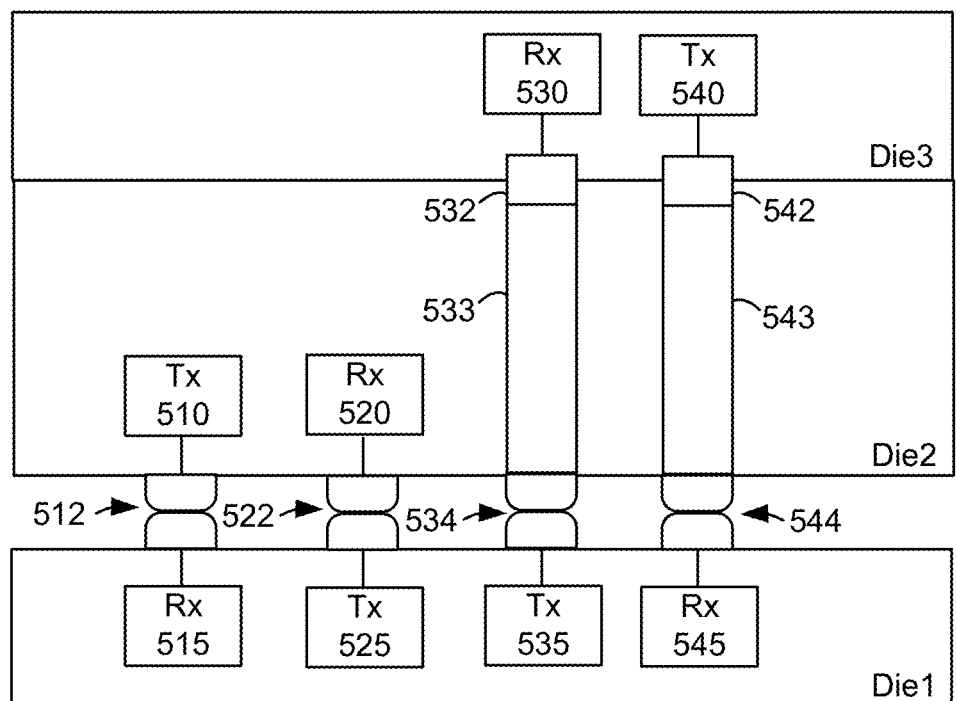
FIG. 5 depicts an example of paths between Tx and Rx functions of adjacent dice and non-adjacent dice, consistent with FIG. 1, and in accordance with various embodiments.

FIG. 5 depicts an example of paths between Tx and Rx functions of adjacent dice and non-adjacent dice, consistent with FIG. 1, and in accordance with various embodiments. In this example, Die1 and Die2 are adjacent, and Die2 and Die3 are adjacent. Additionally, the interconnects for Die1 and Die2 are micro bumps while the interconnects between Die2 and Die3 are hybrid bonding interconnects (HBI). As mentioned, micro bumps can be spaced apart at a 401 μm pitch, for example, where this pitch can be potentially scaled down to 201 μm or 101 μm. HBIs are a type of interconnect which can be used with a pitches of 101 μm and lower. HBIs connect dice in packages using tiny copper-to-copper connections, as opposed to bumps, to provide a greater interconnect density.

An HBI can refer to a permanent bond that combines a dielectric bond with embedded metal to form an interconnect. It is sometimes referred to as a direct bond interconnect. In some cases, the HBI includes adhesives. In other cases, the HBI includes various interconnect metals such as copper (Cu), indium (In), and silver (AG). One example is solid-liquid inter-diffusion (SLID). Another example is a binary bonding approach that uses InAg combined with atmospheric plasma surface activation.

In this example, Die2 is an intermediate die located above Die1 and below Die3. A Tx circuit 510 in Die2 can transmit signals to an Rx circuit 515 in Die1 via a pair of micro bumps 512. A Tx circuit 525 in Die1 can transmit signals to an Rx circuit 520 in Die2 via a pair of micro bumps 522. A Tx circuit 535 in Die1 can transmit signals to an Rx circuit 530 in Die3 via a pair of micro bumps 534, a through-silicon via 533 (TSV) and an HBI 532. A TSV or through-chip via is a vertical electrical connection (via) that passes completely through a silicon wafer or die. TSVs are high-performance interconnect techniques which provide higher density and shorter connections. Similarly, a Tx circuit 540 in Die3 can transmit signals to an Rx circuit 545 in Die1 via an HBI 542, a through-silicon via 543 (TSV) and a pair of micro bumps 544.

The concepts depicted could extend to more than three dice as well. For example, a bottom die, Die1, could transmit signals to a fourth die which is above Die3 using TSVs in Die2 and Die3.

Figure 6:
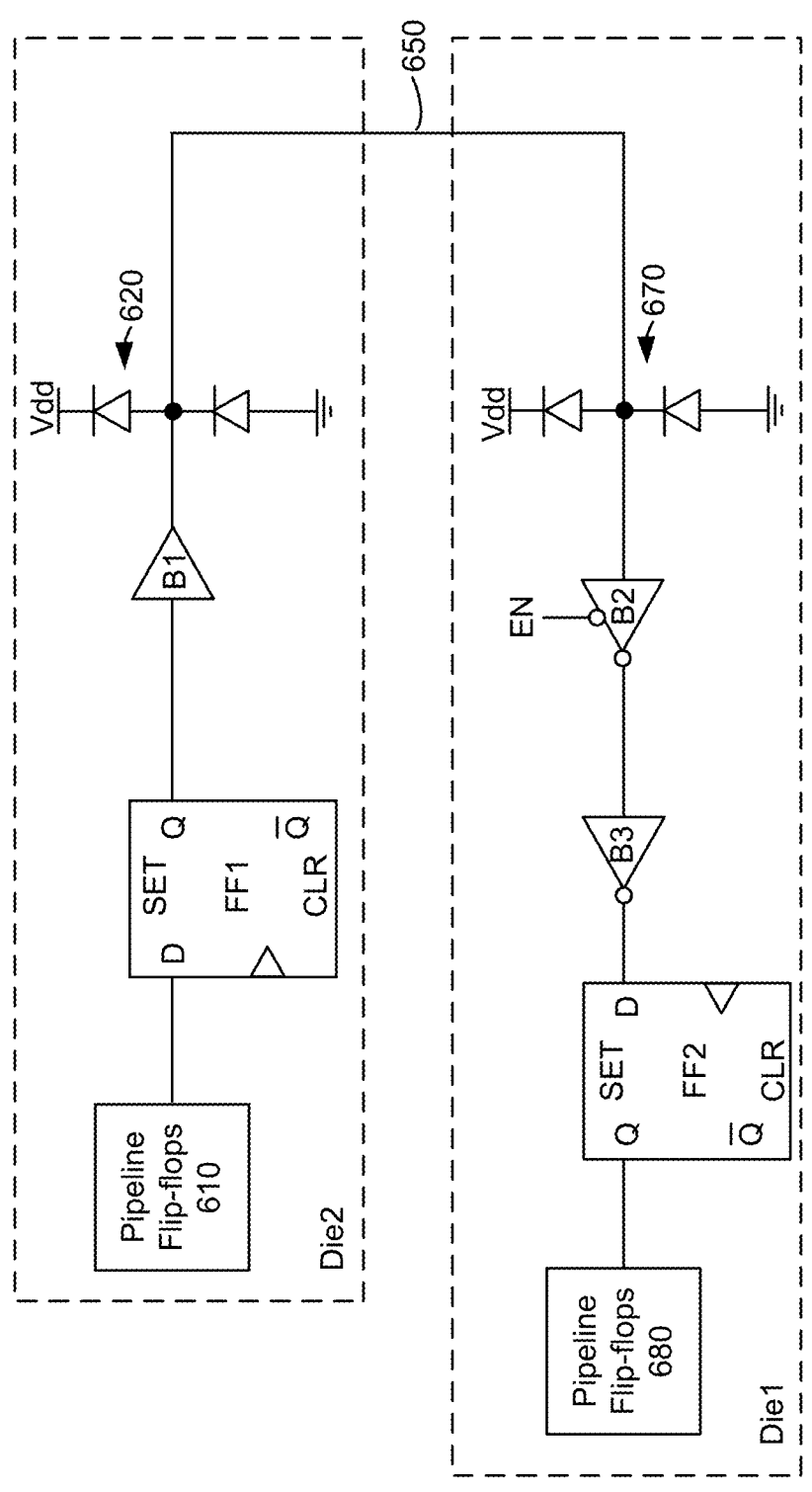
FIG. 6 depicts an example of a logical view of interconnect components, consistent with FIG. 1, and in accordance with various embodiments.

FIG. 6 depicts an example of a logical view of interconnect components, consistent with FIG. 1, and in accordance with various embodiments. This example represents a transmission path from Die2 to Die1. In Die2, a pipeline of flip-flops 610 provides data to a flip-flop FF1. The pipeline receives data from a controller, processor or other control circuit.

FF1 may be an inverting flip flop, also referred to as a D flip flop. FF1 includes a SET input, a CLR (clear) input, a data (D) input and a CLK (clock) input, represented by a triangle, indicating that the flip-flop is edge-triggered. The outputs include Q and Q_bar, the inverse of Q. In this type of flip-flop, when CLK increases, Q is reset to 0 if D=Q=0, or Q is set to 1 if D=Q=1. When CLK decreases, there is no change in Q or Q_bar. Data output from the Q output is provided to a buffer B1 and then to Die1 via an interconnect 650. The interconnect 650 can represent a pair of micro bumps or HBI, for example. A pair of diodes 620 is provided in Die2 for electrostatic discharge protection (ESD). One diode is connected to a power supply Vdd and the other diode is connected to ground.

The data is received in Die1 via the interconnect 650. Die1 also has a pair of diodes 670 for ESD. The data is provided to a tristate buffer B2. A tristate buffer has three possible output states: high (1), low (0) and floating. The tristate buffer has an input A, an output Y and an enable control line E. When the enable input is true, the tristate buffer acts as a simple buffer, transferring the input value to the output. The tristate buffer may be an active-low inverting tristate buffer, in one approach. In this approach, the output is enabled or disabled when a logic level "0" is applied to the enable control line. When the enable signal is a low level or 0, the buffer is enabled and the output is the complement or inverse of the input. When the enable signal is a high level or 1, the buffer is disabled and the output is at a high impedance condition. The tristate buffer can therefore act as a switch by either passing or blocking the inverse of the input data based on whether the switch is turned on or off, respectively. Having an active low buffer is helpful as it reduces the power used for the enable control line.

After the input data is inverted at the tristate buffer B2, it is inverted again to its original state on the interconnect 650 by an inverting buffer B3. The data is then provided to a flip-flop FF2 which operates similarly to FF1. Data output from the Q output is provided to a pipeline of flip-flops 680 for further processing by a controller, processor or other control circuit.

The transmitting die, Die2, could also include buffers such as B2 and B3 after the diode 620 to disconnect the transmit lanes from the micro bumps or other interconnect in a sort test of Die2. In another approach, the transmitting die but not the receiving die includes the buffers B2 and B3. A common enable signal can be used for each of the tristate buffers in a cluster, in one approach.

As described further below, in one aspect, a die can be subject to a test by itself in a sort test, typically before the die is connected to another die. In another aspect, a pair of die can be subject to a class test when they are coupled together directly or indirectly via one or more other die. The sort test may be performed on many die in a wafer, before wafer slicing. Class testing occurs after a die is connected to other die in a multi-die package. In the sort test, the tristate buffer is disabled since there is no interconnect between die and the testing is performed within a single die. In the class test, the tristate buffer is enabled since there is an interconnect between die and the testing requires transmission between two dice.

The interconnect components shown are associated with a single lane in a set of lanes such as depicted in FIGS. 2A and 2B. The interconnect components can be provided for each lane in a set of lanes.

Figures 7A, 7B, 7C, 7D:
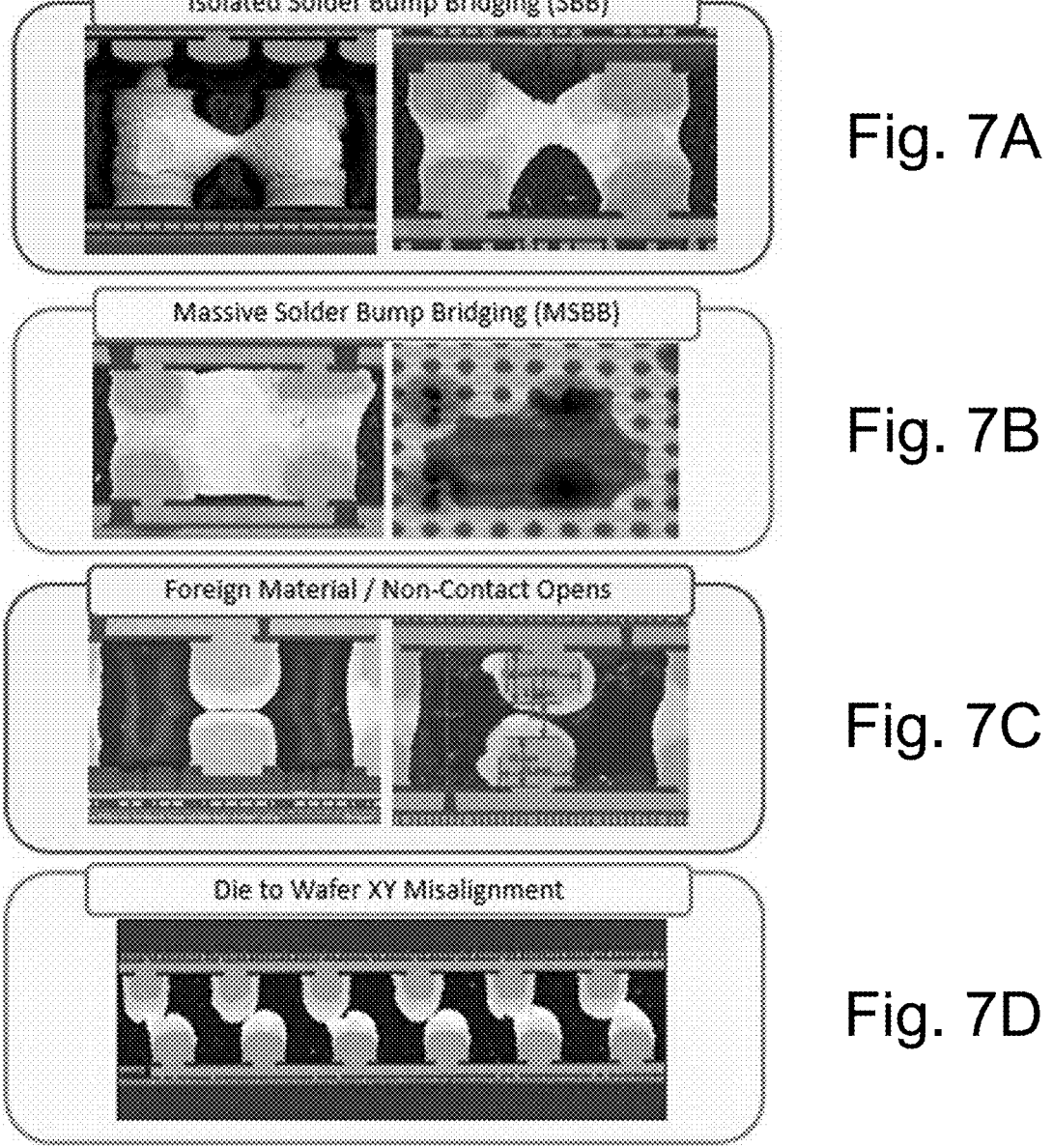
FIG. 7A depicts an example of a first type of defect involving micro bumps, referred to as isolated solder bump bridging.
FIG. 7B depicts an example of a second type of defect involving micro bumps, referred to as massive solder bump bridging (MSBB).
FIG. 7C depicts an example of a third type of defect involving micro bumps, referred to as foreign material/non-contact opens.
FIG. 7D depicts an example of a fourth type of defect involving micro bumps, referred to as die to wafer XY misalignment.

FIG. 7A depicts an example of a first type of defect involving micro bumps, referred to as isolated solder bump bridging. As mentioned, various type of interconnect manufacturing defects are often observed in silicon. The solutions described herein can be better understood in view of these failure mechanisms. Solder Bump Bridging results in a short circuit between two adjacent interconnects. Two redundant lanes can be used to replace the two short-circuited lanes.

To test for such defects, including those in FIG. 7A-7D, random pattern tests generated by linear feedback shift registers (LFSRs) are not adequate. Instead, single line stress tests, described further below, can be used. Single line stress tests include several phases, where each transmit or receive lane is tested separately, one at a time. In a first phase, a first lane is set to be the target or victim while all other lanes are aggressor lanes. In a second phase, a second lane is set to be the target or victim while all other lanes are aggressor lanes, and so forth. Single line stress tests can be used both for testing and identifying failing lanes. A redundant lane can be used to replace each lane which is found to be defective.

FIG. 7B depicts an example of a second type of defect involving micro bumps, referred to as massive solder bump bridging (MSBB). Here, more than two lanes are short circuited together due to a defect. For such defects also, single line stress tests are effective. To repair a short circuit between three lanes, for example, three redundant lanes are required. A multiplexing structure can be provided to perform the repair by routing signals which were intended to travel over a defective path to a replacement path. Generally, the number of such defects which can be repaired is limited to avoid excessive complexity in the multiplexing structure.

FIG. 7C depicts an example of a third type of defect involving micro bumps, referred to as foreign material/non-contact opens. In this case, a foreign material, or a gap, may be present between the two micro bumps which prevents them from contacting one another. Single line stress tests can also be used to detect such defects. Moreover, when the defect involves only one pair of micro bumps, only one redundant lane is required to repair the defect.

FIG. 7D depicts an example of a fourth type of defect involving micro bumps, referred to as die to wafer XY misalignment. In this case, pairs of micro bumps which are intended to contact one another are shifted laterally, e.g., in an x-y direction, where z is a vertical direction, such that the intended contact is not made. This type of defect tends to affect all of the micro bumps in a cluster such that the defect cannot be repaired. Single line stress tests can detect such defects.

Figure 8:
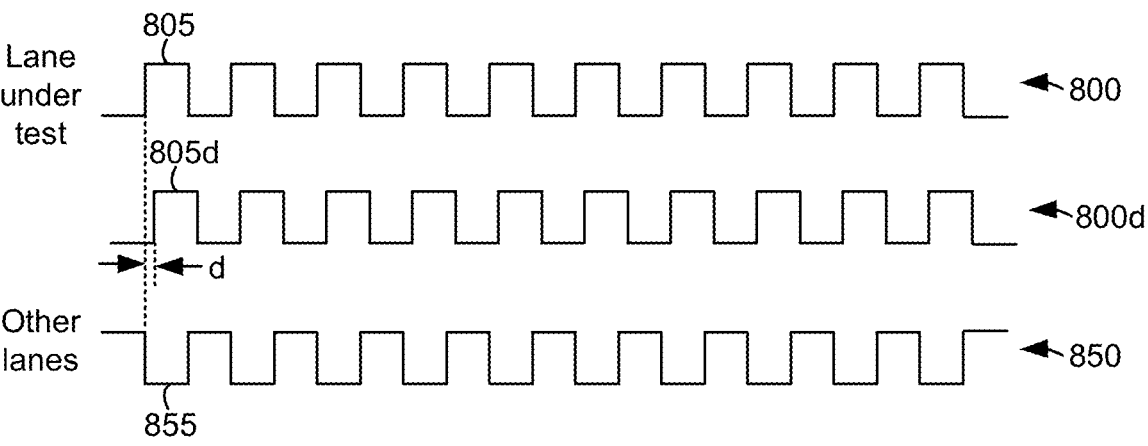
FIG. 8 depicts examples of periodic signals applied to a transmit or receive lane under test, in accordance with various embodiments.

FIG. 8 depicts examples of periodic signals applied to a transmit or receive lane under test, in accordance with various embodiments. As mentioned, to test for defects in the lanes of a cluster, a single line stress test can be performed for each lane, one lane at a time. In one approach, a periodic signal 800 is applied to the lane under test, e.g., the lane currently selected to be tested for a defect, while an opposite-phase periodic signal 850 is applied to the remaining lanes in the cluster. The phase of the periodic signal 850 is shifted 180 degrees, e.g., +/−a threshold such as 10-20 degrees, from the phase of the periodic signal 800. Thus, a peak amplitude in the periodic signal 850 occurs during a minimum amplitude of the period signal 850. The opposite-phase waves tend to capacitively couple to the lane under test. This provides a stress on the lane under test which can modify the signal on the lane under test. If the lane under test is free of defects, the modification of the signal will be relatively small such that a detected signal of the lane under test is as expected, e.g., substantially the same as the periodic signal applied to the lane under test but with an expected shift in time due to the propagation time of the signal.

For example, the signal 800*d* represents a time-shifted version of the signal 800, where the shift is a time period or delay d. This delay corresponds to a difference between the rise times of the pulse 805 and 805*d*, for example. A comparator can be used to detect this signal on the lane under test and to determine whether the detected signal is a time-shifted version of a periodic signal which is applied to the lane under test. For example this may require determining that the delay is equal to an expected delay d+/−a threshold error. The time-shifted version of a periodic signal which is applied to the lane under test is an example of an expected response on the lane under test.

The period signals can be a square wave, as depicted, or a sine wave, for example.

In this example, the signal 800 is a square wave with a first pulse 805 and the signal 850 is a square wave with first pulse 855. The first pulse 805 has a high amplitude while the time-aligned first pulse 855 has a low amplitude.

As mentioned, in a single line stress test, each transmit or receive lane is tested separately, one at a time. In a first phase, a first lane is set to be the target or victim while all other lanes are aggressor lanes. In a second phase, a second lane is set to be the target or victim while all other lanes are aggressor lanes, and so forth. Thus, in each test, the signal 800 can be applied to the lane under test while the signal 850 is applied to the other, remaining lanes in a cluster. The testing can be performed on a cluster basis to identify defective lanes in a cluster and replace them with replacement lanes.

Advantageously, the two periodic signals can be used to detect different types of defects including those depicted in FIG. 7A-7D. This reduces complexity compared to having defect-specific test signals.

Figure 9A:
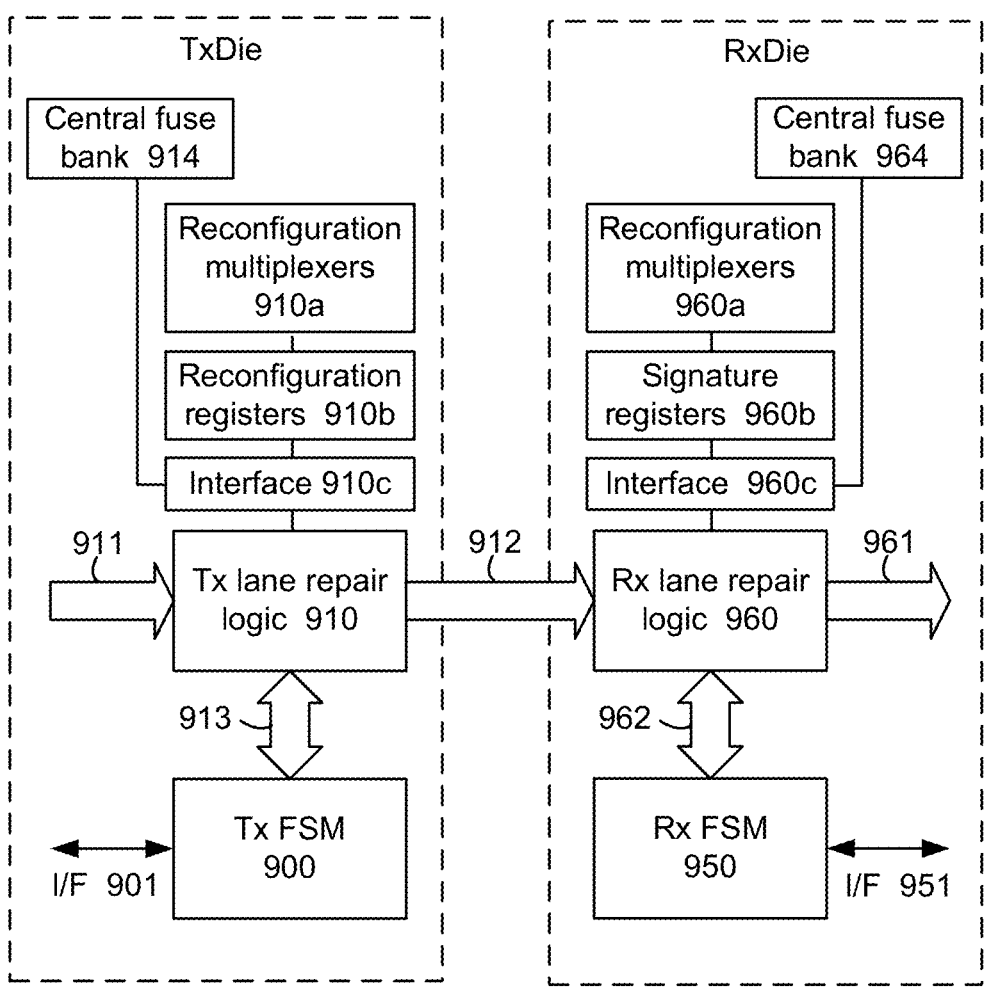
FIG. 9A depicts an example of an interconnect architecture for a cluster, in accordance with various embodiments.

FIG. 9A depicts an example of an interconnect architecture for a cluster, in accordance with various embodiments. The architecture may be provided for each cluster, in one approach, except that a central fuse bank may be shared among multiple clusters in a die, in one approach. In this architecture, one die is the transmitting die (TxDie), e.g., the die transmitting a signal, and the other die is the receiving die (RxDie), e.g., the die receiving a signal. Generally, the architecture includes built-in self-test (BIST) components at the Tx and Rx dice. The Tx die includes the Tx end lanes through which functional signals are propagated. It also contains the redundant lanes, repair reconfiguration multiplexers, reconfiguration registers and an interface to a central fuse bank, such as an electrical fuse bank. The Tx die also contains the Tx finite state machine (FSM) which generates the test stimuli, analyzes the response, and identifies the failing lane based on which it calculates the repair signature. Similarly, the Rx die contains lanes, including the redundant lanes, carrying the functional signals, repair configuration multiplexers, signature registers and an interface to a central fuse bank on the Rx die. The Rx die also contains the Rx FSM which can generate the test stimuli, analyze the response, and identify the failing lane.

In particular, the TxDie includes Tx lane repair logic 910 and a Tx finite state machine (FSM) 900. The Tx lane repair logic 910 receives data on an input path 911, e.g., from a controller, processor or other control circuit, and outputs the data on an interconnect path 912. The input path and output path may represent the normal or default lanes in a cluster, for example. The Tx lane repair logic 910 may include reconfiguration multiplexers 910*a* which route an incoming signal to a redundant lane when the lane which would normally carry the signal is found to be defective. For example, in FIG. 2A, if L2 is defective, the signal which would normally be carried by L2 may be routed to L1r, the first redundant lane. The reconfiguration multiplexers 910*a* can be configured based on reconfiguration information read into reconfiguration registers 910*b* from a central fuse bank 914 via an interface 910*c*. This can be done at the time of powering up the TxDie, for example.

The reconfiguration information can be obtained by the Tx FSM 900 during testing of the lanes of the Tx Die. The Tx lane repair logic 910 may communicate with the Tx FSM 900 via an interface 913.

The Tx FSM 900 in turn may communicate with a controller, processor or other control circuit via an interface (UF) 901 such as one using the IEEE-P1687 Internal Joint Test Action Group (iJTAG) standard, titled "IEEE P1687 Standard for Access and Control of Instrumentation Embedded within a Semiconductor Device." This is a standard interface to control configurations within the state machine and read out the contents of the state machine.

The RxDie includes Rx lane repair logic 960 and an Rx finite state machine (FSM) 950. The Rx lane repair logic 960 receives signals on the interconnect path 912 and outputs corresponding signals on an output path 961, e.g., to a controller, processor or other control circuit. The Rx lane repair logic 960 may include reconfiguration multiplexers 960*a* which route an incoming signal on a redundant lane to a lane which would normally carry the signal. For example, in FIG. 2A, if a signal which would normally be carried on L2 in TxDie is received on L1r, the signal may be routed back to L2 in RxDie. The reconfiguration multiplexers 960*a* can be configured based on reconfiguration information read into signature registers 960*b* from a central fuse bank 964 via an interface 960*c*. This can be done at the time of powering up the RxDie, for example. See FIG. 10 for further details of the Tx FSM and Rx FSM.

The Rx lane repair logic 960 may communicate with the Rx FSM 950 via an interface 962. The Rx FSM 950 in turn may communicate with a controller, processor or other control circuit via an interface (UF) 951.

The fuses comprise non-volatile memory so that the reconfiguration information can be permanently stored for the lifetime of a die.

Figure 9B:
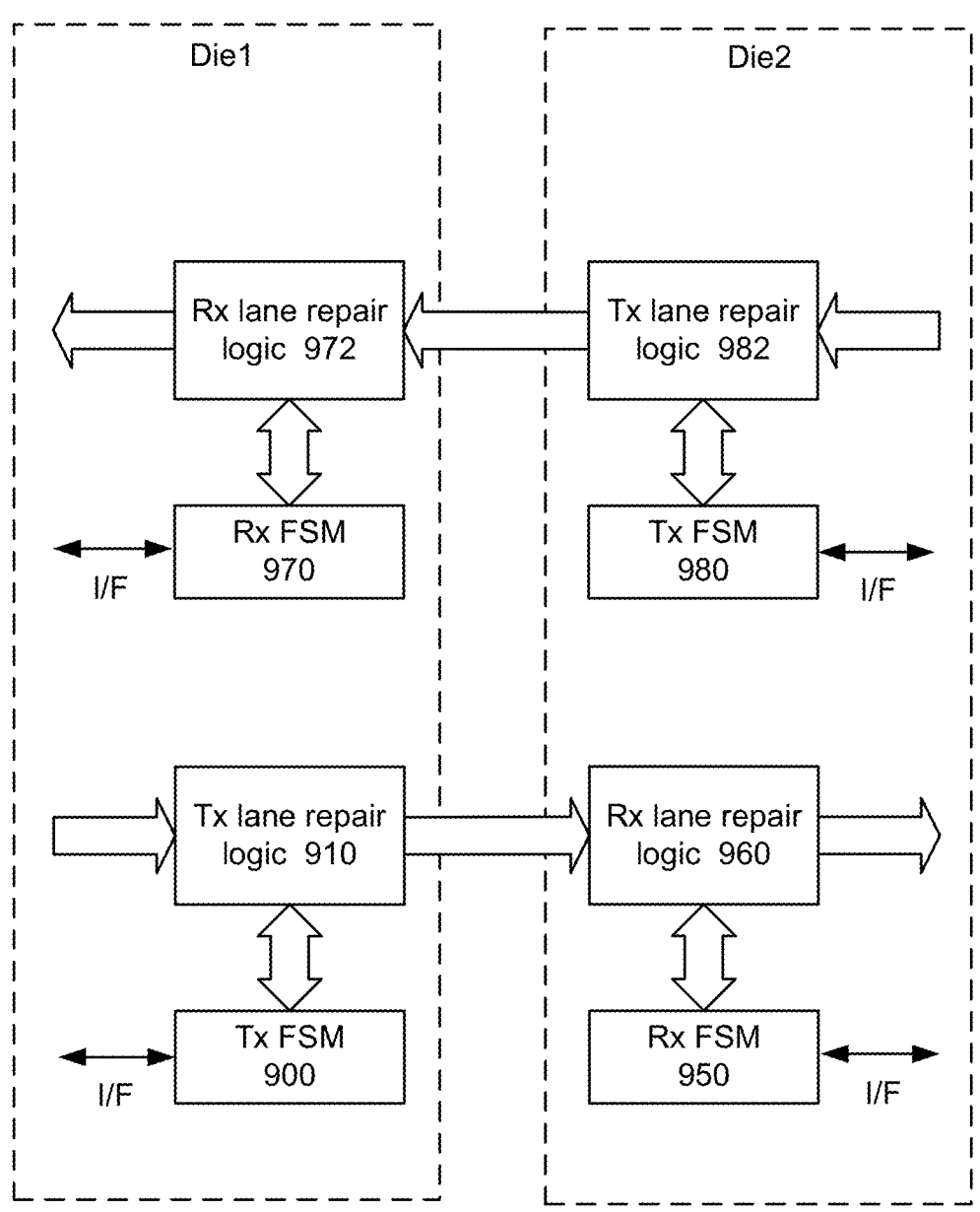
FIG. 9B depicts an example of an interconnect architecture for a pair of clusters, in accordance with various embodiments.

FIG. 9B depicts an example of an interconnect architecture for a pair of clusters, in accordance with various embodiments. This example includes the Tx FSM 900, Tx lane repair logic 910, Rx FSM 950 and Rx lane repair logic 960 of FIG. 9A, in connection with a first cluster of lanes such as the lanes associated with the Tx cluster 110*a* and Rx cluster 110*b* of FIG. 1. The example further includes components associated with an additional cluster on the same die. This includes a Tx FSM 980 and Tx lane repair logic 982 on Die2, and an Rx FSM 970 and Rx lane repair logic 972 on Die1, in connection with a second cluster of lanes such as the lanes associated with the Tx cluster 112*a* and Rx cluster 112*b* of FIG. 1. Providing a separate FSM and testing of each cluster helps reduce complexity and reduce test time since different clusters can be tested concurrently. Although, it is possible to provide one FSM for testing multiple clusters.

The Tx FSM 900 and Rx FSM 970 are examples of first and second FSMs, respectively, on a die, Die1.

Figure 10:
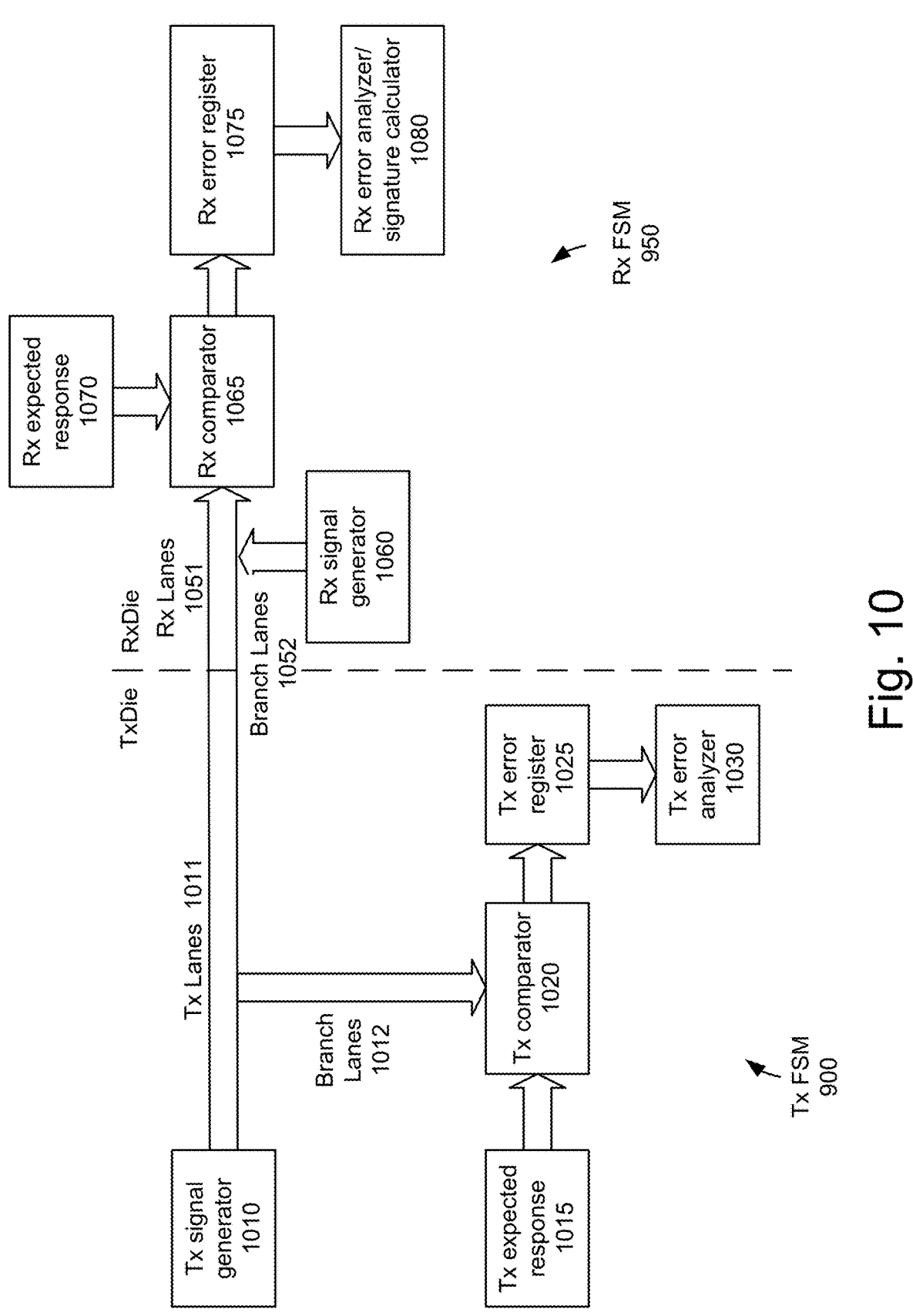
FIG. 10 depicts an example configuration of the finite state machines (FSMs) 900 and 950 of FIG. 9A, in accordance with various embodiments.

FIG. 10 depicts an example configuration of the finite state machines (FSMs) 900 and 950 of FIG. 9A, in accordance with various embodiments. Both the TxDie and the RxDie can include: (i) a test stimulus/signal generator; (ii) an expected response generator; (iii) a comparator comparing the expected response with the observed response; (iv) error register, one per lane; and (v) an error analyzer which calculates the repair signature, if repair is possible. A repair is generally possible when the number of redundant lanes is adequate to substitute for the defective lanes. The stimulus generator can be, e.g., a linear feedback shift register (LFSR) or a single line stress test stimulus generator. The expected response mirrors the stimulus generated by the stimulus generator.

Not all components shown are used simultaneously. As shown, for sort testing, where only a single die is tested in a standalone mode, all the components shown on the die are used. For class testing, where testing is done post-packaging, the test generator at the Tx die and the expected response generator and comparator at the Rx die are used. In this case, the Rx die calculates the repair signature, a copy of which is then moved to the Tx die. A repair signature can identify a defective lane and a corresponding replacement lane.

In an example implementation, during a test for defects in a cluster, a Tx signal generator 1010 transmits or applies periodic test signals on Tx lanes 1011, such as depicted in FIG. 8. If the Tx die alone is being tested, in a sort test, the Tx lanes 1011 are not connected to the Rx lanes 1051 of the RxDie. Instead, the test signals are carried on branch lanes 1012 to a Tx comparator 1020. For the lane under test, The Tx comparator detects a signal on the lane under test and compares it to an expected response as provided by a Tx expected response function 1015. For example, the Tx comparator can compare an amplitude and/or phase of the detected signal to an expected amplitude and/or phase. For instance, the timing of low-to-high transitions and/or high-to-low transitions in the detected signal can be compared to expected timings. If the timing differs from the expected timing by more than a specified amount, the lane under test is considered to be defective. Other factors such as the number of clock pulses in the detected signal can be compared with an expected number of clock pulses in a time period. If there is a defect/error in a lane under test, a Tx error register 1025 stores the identity of the lane and a Tx error analyzer 1030 calculates the repair signature, if repair is possible.

If the Tx die is being tested in connection with the Rx die, in a class test, the Rx lanes 1051 are not connected to the Rx lanes 1051 of the RxDie. The tristate buffers B2 (FIG. 6) or other switches in line with the Rx lanes can be provided in a turned on or conductive state in this case to allow the received test signals to reach an Rx comparator 1065. For the lane under test, the Rx comparator detects a signal on the lane under test and compares it to an expected response as provided by an Rx expected response function 1070, similar to the way the Tx comparator works. If there is a defect/error in a lane under test, an Rx error register 1075 stores the identity of the lane and an Rx error analyzer 1080 calculates the repair signature, if repair is possible.

If the Rx die is being tested alone, in a sort test, an Rx signal generator 1060 transmits or applies periodic test signals on the Rx lanes 1051 via branch lanes 1052. The tristate buffers B2 (FIG. 6) or other switches in line with the Rx lanes can be turned off in this case to disconnect the Rx lanes from the micro bumps or other interconnect of the RxDie. The test signals are provided to the Rx comparator 1065 for analysis as discussed.

Test signals transmitted between the dies, from the TxDie to the RxDie, can be the same as, or different than, the test signals transmitted only within a die in a sort test, in one approach. Also, a test signal transmitted within a Tx die in a sort test can be the same as, or different than, a test signal transmitted within an Rx die in a sort test.

In a sort test, the techniques disclosed herein provide failure analysis using die isolation. A tristate buffer or other switch on the Tx or Rx die can be used to isolate the die when the die is connected to another die. System test support is also provided. A signal (FBIST_SYSTEST_START) is provided to the FSM at the Tx and Rx dice from a controller, processor other control circuit, to trigger the execution of a BIST on each die. The two die can be tested concurrently, for example. The FSM on the Tx die generates a test pattern, and the FSM on the Rx die reports the pass/fail status of the test. A signal (FBIST_SYSTEST_FAIL) can be generated for each cluster. These signals from all the clusters can be aggregated to indicate, at the system level, the pass/fail status of the test.

Test support in the field is also provided by leveraging FBIST_SYSTEST_START and FBIST_SYSTEST_FAIL to initiate an interconnect test as part of power-on self-test of a die.

Figure 11:
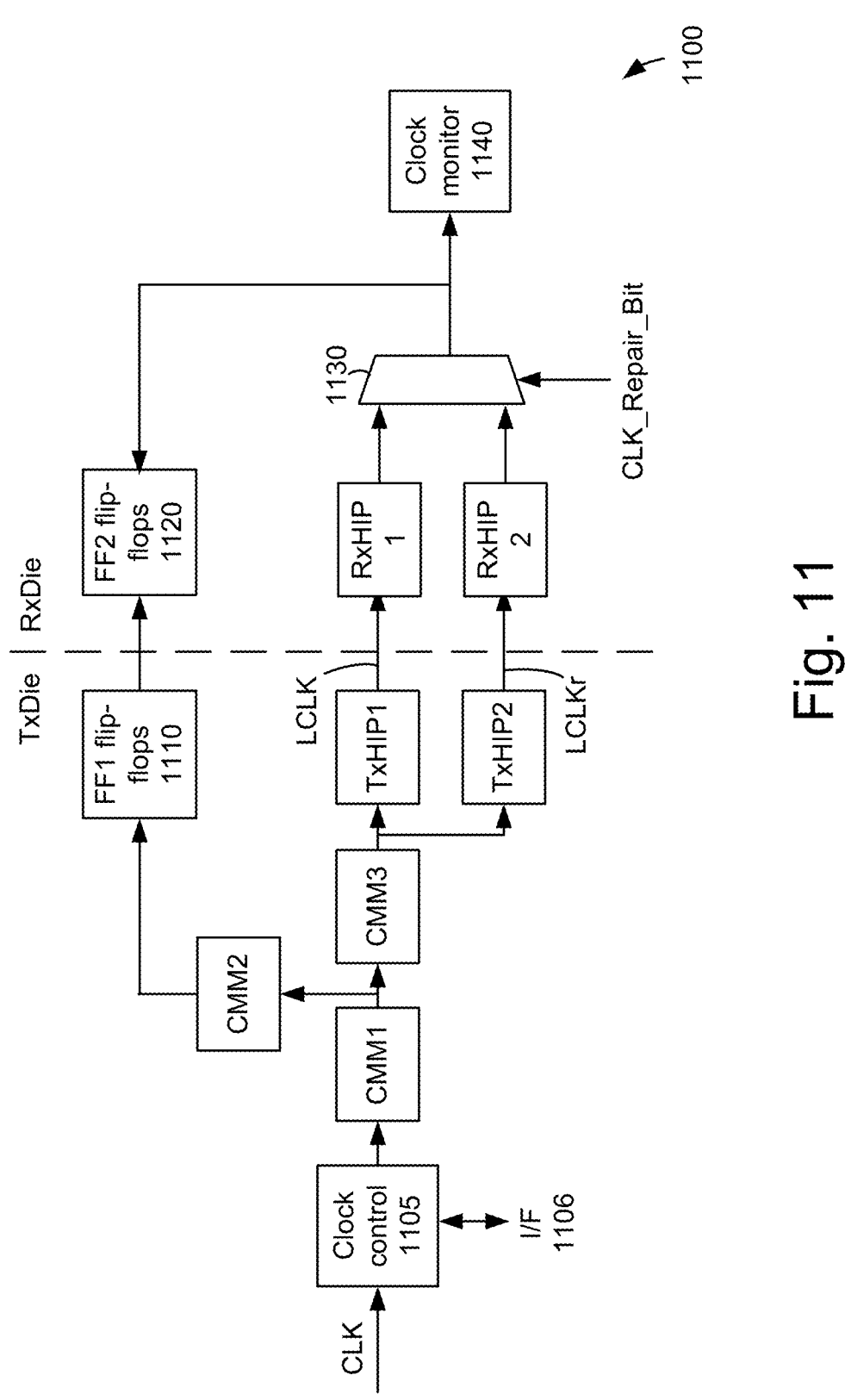
FIG. 11 depicts an example configuration of a clocking structure, consistent with FIG. 1, and in accordance with various embodiments.

FIG. 11 depicts an example configuration of a clocking structure 1100, consistent with FIG. 1, and in accordance with various embodiments. As indicated in connection with FIG. 2C, a clock signal can be provided concurrently on both a normal or default clock lane and on an extra clock lane for use in case the normal, default clock lane is found to be defective during testing. This feature thus involves clock test and repair support where one or more redundant lanes are provided for a clock signal which is transmitted between dice. An example BIST clocking structure is provided. The structure includes a clock control circuit 1105 which receives a clock signal CLK and provide a corresponding output to a first clock modifier module (CMM1). CMM1 in turn provides an output to a second clock modifier module (CMM2). CMM2 in turn provides an output to the FF1 flip-flops 1110. The FF1 flip-flops 1110 represent a bank or set of the FF1 flip-flops such as shown in FIG. 6, one for each lane in a cluster of the TxDie. Under the control of the clock signal, the FF1 flip-flops provide data via die-to-die interconnects to the FF2 flip-flops 1120 in the RxDie. The FF2 flip-flops 1120 represent a bank or set of the FF2 flip-flops such as shown in FIG. 6, one for each lane in a cluster of the RxDie.

CMM2 also provides an output to a third clock modifier module (CMM3). CMM3 in turn provides an output to TxHIP1 and TxHIP2. TxHIP1 and TxHIP2 are components of the Tx die which include the buffer B1 and the ESD diode 620 of FIG. 6. TxHIP1 and TxHIP2 are coupled to the two clock lanes, LCLK and LCLKr, which are added to the inter-die connections. If LCLK is functioning, then the clock propagated along that lane is used. Otherwise, if LCLK is not functioning, e.g., has a short circuit, open circuit or other defect, then the same clock propagated along LCLKr is used. LCLK and LCLKr are coupled to RxHIP1 and RxHIP2, respectively. RxHIP1 and RxHIP2 are components of the Rx die which include the buffers B2 and B3 and the ESD diode 670 of FIG. 6.

The clock lane to be used by a clock monitor 1140 is selected by a multiplexer 1130 based on an input signal, CLK Repair Bit.

At the Tx die, the clock control circuit 1105 controls the clock burst used for testing the interconnects, where the number of clock cycles is programmable through an interface (I/F) 1106 such as iJTAG. At the Rx die, the clock monitor 1140 counts the number of clock cycles. To test the clock path, the clock control circuit can be set to send out a pre-determined number of clock pulses. The clock monitor counts the number of clock pulses received, where the observed clock count observed determines the quality of the clock lane. The clock monitor can then set CLK_Repair_Bit to select the clock signal on LCLK if that clock signal has a good quality, e.g., is not defective, or the clock signal on LCLKr if the clock signal on LCLK is defective.

Moreover, at the Tx die, the programmable clock modifier modules CMM1-CMM3 can be used to: (i) move the clock edge; and (ii) modify the duty cycle. These clock modifiers are used to: (i) measure and tune the skew between the data and the clock, at both the Tx and Rx dice; and (ii) compensate for discrepancies in silicon in the clock network between the two die.

Thus, the clocking structure can be used to determine if a lane, e.g., LCLK, for transmitting a clock signal between dice has a defect. If the lane has a defect, a copy of the clock signal on another lane, e.g., LCLKr, is used to provide the clock signal to the RxDie. The two (or more) lanes LCLK and LCLKr can be added to the lanes of a cluster shown in FIG. 2C, for example.

In an example implementation, an apparatus includes first and second clock lanes to carry a clock signal; a clock monitor to determine whether the clock signal on the first clock lane is defective; and a multiplexer, responsive to the clock monitor, to select the clock signal on the first clock lane if the clock signal on the first clock lane is not defective, and the clock signal on the second clock lane if the clock signal on the first clock lane is defective.

FIG. 12 depicts a flowchart of an example process for performing sort testing of a chip Tx cluster, in accordance with various embodiments. Step 1200 begins sort testing of a chip Tx cluster. Step 1201 includes selecting a Tx cluster to test, e.g., among multiple Tx clusters on the chip. Step 1202 includes disconnecting the Tx lanes from the interconnect, e.g., using a tristate buffer as discussed previously in connection with FIG. 6, if such a buffer is provided for the Tx cluster. Step 1203 includes selecting a Tx lane to test, e.g., among multiple Tx lanes of the cluster. Step 1204 includes a Tx signal generator for the cluster applying a first periodic signal (e.g., signal 800 in FIG. 8) to the Tx lane under test and a second periodic signal (e.g., signal 850 in FIG. 8) to other Tx lanes.

At step 1205, a Tx comparator compares a detected signal on the Tx lane under test to an expected response. At step 1206, a Tx error register identifies one or more defective Tx lanes and corresponding replacement Tx lanes. A decision step 1207 then determines whether there is a next Tx lane in the cluster to test. If the decision step 1207 is true (T), step 1203 is repeated. If the decision step 1207 is false (F), a decision step 1208 determines whether there is a next Tx cluster on the die to test. If the decision step 1208 is true, step 1201 is repeated. If the decision step 1208 is false, the process is done at step 1209.

FIG. 13 depicts a flowchart of an example process for performing sort testing of a chip Rx cluster, in accordance with various embodiments. Step 1300 begins sort testing of a chip Rx cluster. Step 1301 includes selecting an Rx cluster to test, e.g., among multiple Rx clusters on the chip. Step 1302 includes disconnecting the Rx lanes from the interconnect, e.g., using a tristate buffer as discussed previously in connection with FIG. 6, if such a buffer is provided for the Rx cluster. Step 1303 includes selecting an Rx lane to test, e.g., among multiple Rx lanes of the cluster. Step 1304 includes an Rx signal generator for the cluster applying a third periodic signal (e.g., signal 800 in FIG. 8) to the Rx lane under test and a fourth periodic signal (e.g., signal 850 in FIG. 8) to other Rx lanes.

At step 1305, an Rx comparator compares a detected signal on the Rx lane under test to an expected response. At step 1306, an Rx error register identifies one or more defective Rx lanes and corresponding replacement Rx lanes. A decision step 1307 then determines whether there is a next Rx lane in the cluster to test. If the decision step 1307 is true (T), step 1303 is repeated. If the decision step 1307 is false (F), a decision step 1308 determines whether there is a next Rx cluster on the die to test. If the decision step 1308 is true, step 1301 is repeated. If the decision step 1308 is false, the process is done at step 1309.

Figure 14:
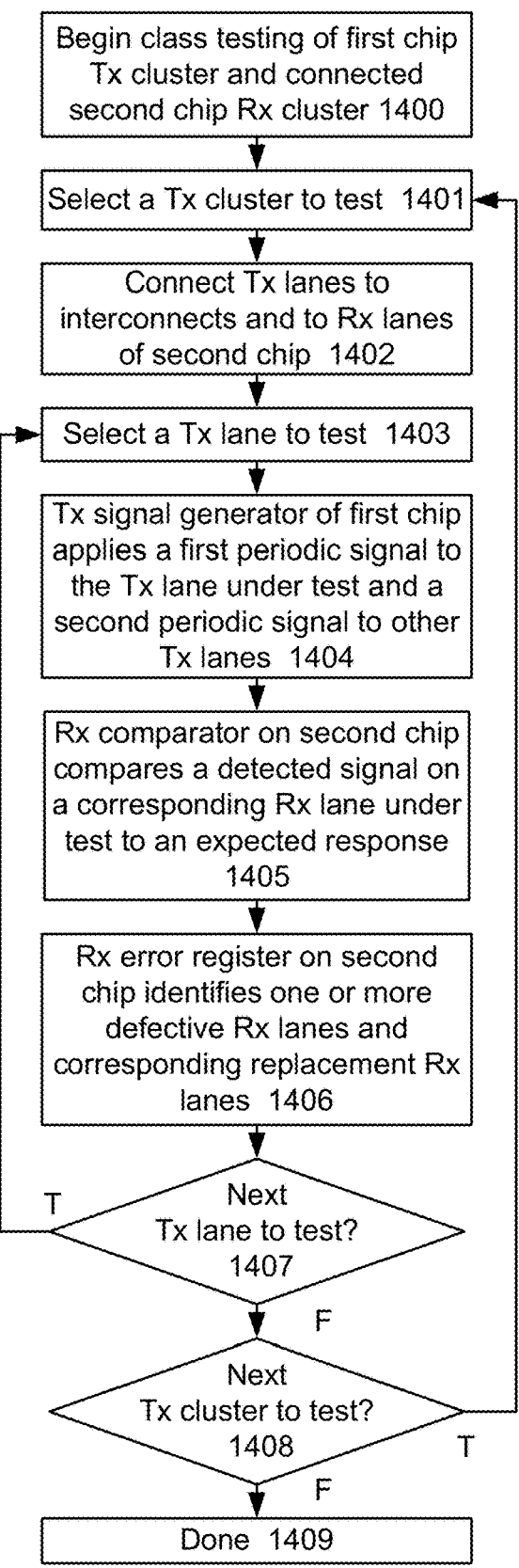
FIG. 14 depicts a flowchart of an example process for performing class testing of a first chip Tx cluster and a second chip Rx cluster, in accordance with various embodiments.

FIG. 14 depicts a flowchart of an example process for performing class testing of a first chip Tx cluster and a second chip Rx cluster, in accordance with various embodiments. Step 1400 includes beginning class testing of a first chip Tx cluster and a connected second ship Rx cluster, e.g., such as the Tx cluster 110a and the Rx cluster 110b, respectively, of FIG. 1. Step 1401 includes selecting a Tx cluster to test. Step 1402 includes connecting the Tx lanes to the interconnects and to the Rx lanes of the second chip. The interconnects could be micro bumps or hybrid bonding interconnects, for example. The connection can involve enabling a tristate buffer or other switch, for example.

Step 1403 includes selecting a Tx lane to test. Step 1404 includes a Tx signal generator of the first chip applying a first periodic signal to the Tx lane under test and a second periodic signal to other Tx lanes. At step 1405, an Rx comparator on the second chip compares a detected signal on a corresponding Rx lane under test to an expected response. At step 1406, an Rx error register on the second chip identifies one or more defective Rx lanes and corresponding replacement Rx lanes. A decision step 1407 then determines whether there is a next Tx lane in the cluster of the first chip to test. If the decision step 1407 is true (T), step 1403 is repeated. If the decision step 1407 is false (F), a decision step 1408 determines whether there is a next Tx cluster on the first chip to test. If the decision step 1408 is true, step 1401 is repeated. If the decision step 1408 is false, the process is done at step 1409.

In one approach, the process can first involve resetting the Tx and Rx dice using a common controller, processor or other control circuit (e.g., common to both die under test). The Rx die is then instructed to wait for signals from the Tx die, and the Tx die is instructed to start the test. It is a deterministic test so, after a certain time period, it will terminate. After it is completed, the common controller, processor or other control circuit reads out the signature registers from the Rx die. The test does not require a higher level communication path between the Tx die and Rx die. Moreover, the testing can be done during manufacturing using external automated test equipment (ATE). Information can be read out from each die independently through a test access port (TAP) or JTAG test interface.

Note that a lane can be found to be defective in one test, e.g., a class test, but not in a sort test. The repair signature for a cluster can account for both types of tests to replace a lane which is found to be defective in any of the tests. In one approach, an error analyzer is coupled to a comparator in a FSM in a first chip, and the error analyzer is to provide a repair signature which identifies one or more replacement lanes for one or more defective lanes in response to a test of each lane of the set of lanes which does not involve a second chip, e.g., a sort test of the first chip, and in response to a test of each lane of the set of lanes which does involve the second chip, e.g., a class test of the first chip.

Figure 15:
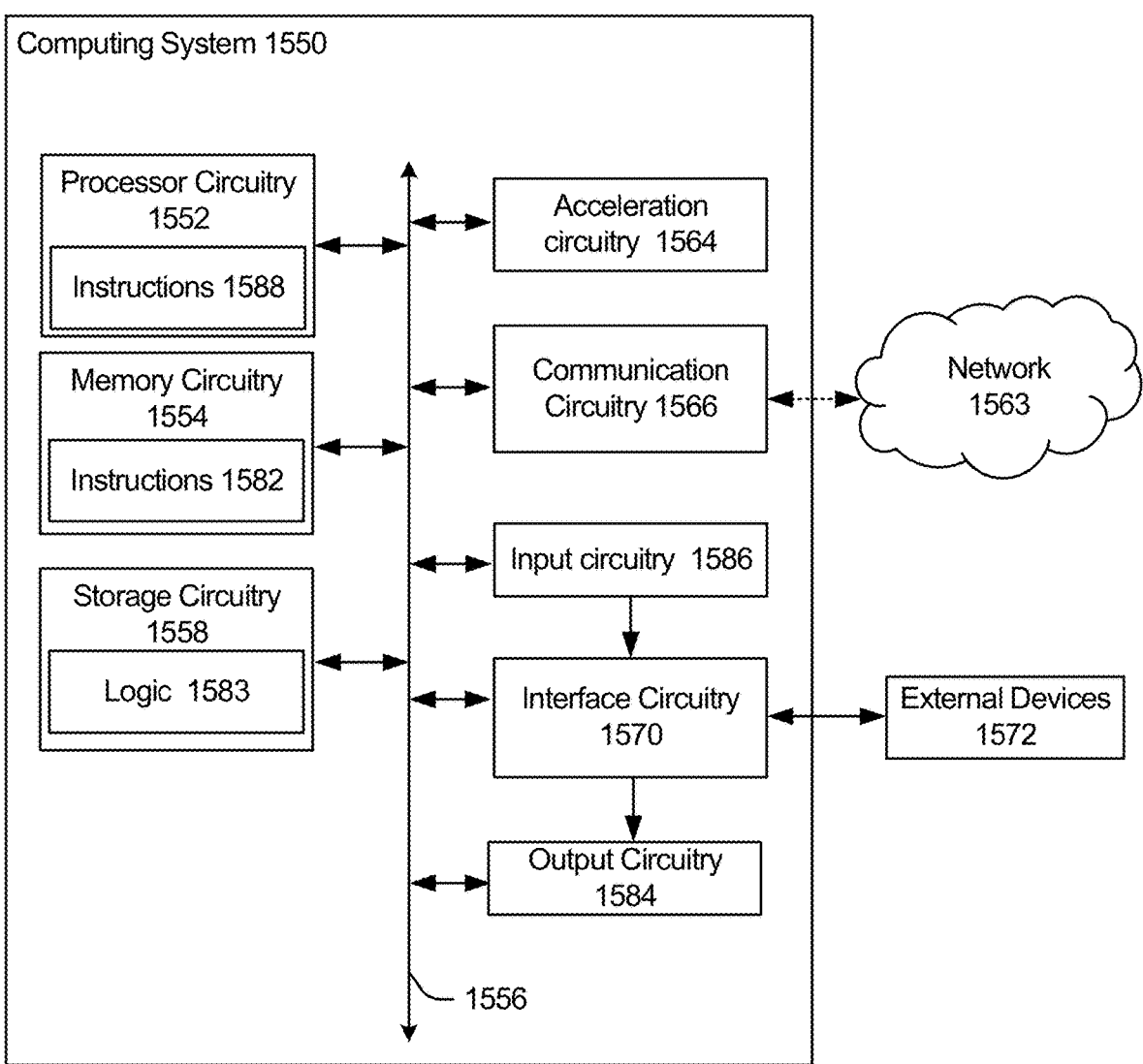
FIG. 15 illustrates an example of components that may be present in a computing system 1550 for implementing the techniques (e.g., operations, processes, methods, and methodologies) described herein.

FIG. 15 illustrates an example of components that may be present in a computing system 1550 for implementing the techniques (e.g., operations, processes, methods, and methodologies) described herein. The memory circuitry 1554 may store instructions and the processor circuitry 1552 may execute the instructions to perform the functions described herein including the processes of FIG. 12-14. The controller, processor or other control circuit mentioned above can include the processor circuitry 1552.

The computing system 1550 may include any combinations of the hardware or logical components referenced herein. The components may be implemented as ICs, portions thereof, discrete electronic devices, or other modules, instruction sets, programmable logic or algorithms, hardware, hardware accelerators, software, firmware, or a combination thereof adapted in the computing system 1550, or as components otherwise incorporated within a chassis of a larger system. For one embodiment, at least one processor 1552 may be packaged together with computational logic 1582 and configured to practice aspects of various example embodiments described herein to form a System in Package (SiP) or a System on Chip (SoC).

The system 1550 includes processor circuitry in the form of one or more processors 1552. The processor circuitry 1552 includes circuitry such as, but not limited to one or more processor cores and one or more of cache memory, low drop-out voltage regulators (LDOs), interrupt controllers, serial interfaces such as SPI, I2C or universal programmable serial interface circuit, real time clock (RTC), timer-counters including interval and watchdog timers, general purpose I/O, memory card controllers such as secure digital/multi-media card (SD/MMC) or similar, interfaces, mobile industry processor interface (MIPI) interfaces and Joint Test Access Group (JTAG) test access ports. In some implementations, the processor circuitry 1552 may include one or more hardware accelerators (e.g., same or similar to acceleration circuitry 1564), which may be microprocessors, programmable processing devices (e.g., FPGA, ASIC, etc.), or the like. The one or more accelerators may include, for example, computer vision and/or deep learning accelerators. In some implementations, the processor circuitry 1552 may include on-chip memory circuitry, which may include any suitable volatile and/or non-volatile memory, such as DRAM, SRAM, EPROM, EEPROM, Flash memory, solid-state memory, and/or any other type of memory device technology, such as those discussed herein The processor circuitry 1552 may include, for example, one or more processor cores (CPUs), application processors, GPUs, RISC processors, Acorn RISC Machine (ARM) processors, CISC processors, one or more DSPs, one or more FPGAs, one or more PLDs, one or more ASICs, one or more baseband processors, one or more radio-frequency integrated circuits (RFIC), one or more microprocessors or controllers, a multi-core processor, a multithreaded processor, an ultra-low voltage processor, an embedded processor, or any other known processing elements, or any suitable combination thereof. The processors (or cores) 1552 may be coupled with or may include memory/storage and may be configured to execute instructions stored in the memory/ storage to enable various applications or operating systems to run on the platform 1550. The processors (or cores) 1552 is configured to operate application software to provide a specific service to a user of the platform 1550. In some embodiments, the processor(s) 1552 may be a special-purpose processor(s)/controller(s) configured (or configurable) to operate according to the various embodiments herein.

As examples, the processor(s) 1552 may include an Intel® Architecture Core™ based processor such as an i3, an i5, an i7, an i9 based processor; an Intel® microcontroller-based processor such as a Quark™, an Atom™, or other MCU-based processor; Pentium® processor(s), Xeon® processor(s), or another such processor available from Intel® Corporation, Santa Clara, California. However, any number other processors may be used, such as one or more of Advanced Micro Devices (AMD) Zen® Architecture such as Ryzen® or EPYC® processor(s), Accelerated Processing Units (APUs), MxGPUs, Epyc® processor(s), or the like; A5-A12 and/or S1-S4 processor(s) from Apple® Inc., Snapdragon™ or Centrig™ processor(s) from Qualcomm® Technologies, Inc., Texas Instruments, Inc.® Open Multimedia Applications Platform (OMAP)™ processor(s); a MIPS-based design from MIPS Technologies, Inc. such as MIPS Warrior M-class, Warrior I-class, and Warrior P-class processors; an ARM-based design licensed from ARM Holdings, Ltd., such as the ARM Cortex-A, Cortex-R, and Cortex-M family of processors; the ThunderX2® provided by Cavium™, Inc.; or the like. In some implementations, the processor(s) 1552 may be a part of a system on a chip (SoC), System-in-Package (SiP), a multi-chip package (MCP), and/ or the like, in which the processor(s) 1552 and other components are formed into a single integrated circuit, or a single package, such as the Edison™ or Galileo™ SoC boards from Intel® Corporation. Other examples of the processor(s) 1552 are mentioned elsewhere in the present disclosure.

The system 1550 may include or be coupled to acceleration circuitry 1564, which may be embodied by one or more AI/ML accelerators, a neural compute stick, neuromorphic hardware, an FPGA, an arrangement of GPUs, one or more SoCs (including programmable SoCs), one or more CPUs, one or more digital signal processors, dedicated ASICs (including programmable ASICs), PLDs such as complex (CPLDs) or high complexity PLDs (HCPLDs), and/or other forms of specialized processors or circuitry designed to accomplish one or more specialized tasks. These tasks may include AI/ML processing (e.g., including training, inferencing, and classification operations), visual data processing, network data processing, object detection, rule analysis, or the like. In FPGA-based implementations, the acceleration circuitry 1564 may comprise logic blocks or logic fabric and other interconnected resources that may be programmed (configured) to perform various functions, such as the procedures, methods, functions, etc. of the various embodiments discussed herein. In such implementations, the acceleration circuitry 1564 may also include memory cells (e.g., EPROM, EEPROM, flash memory, static memory (e.g., SRAM, anti-fuses, etc.) used to store logic blocks, logic fabric, data, etc. in LUTs and the like.

In some implementations, the processor circuitry 1552 and/or acceleration circuitry 1564 may include hardware elements specifically tailored for machine learning and/or artificial intelligence (AI) functionality. In these implementations, the processor circuitry 1552 and/or acceleration circuitry 1564 may be, or may include, an AI engine chip that can run many different kinds of AI instruction sets once loaded with the appropriate weightings and training code. Additionally or alternatively, the processor circuitry 1552 and/or acceleration circuitry 1564 may be, or may include, AI accelerator(s), which may be one or more of the aforementioned hardware accelerators designed for hardware acceleration of AI applications. As examples, these processor(s) or accelerators may be a cluster of artificial intelligence (AI) GPUs, tensor processing units (TPUs) developed by Google® Inc., Real AI Processors (RAPs™) provided by AlphalCs®, Nervana™ Neural Network Processors (NNPs) provided by Intel® Corp., Intel® Movidius™ Myriad™ X Vision Processing Unit (VPU), NVIDIA® PX™ based GPUs, the NM500 chip provided by General Vision®, Hardware 3 provided by Tesla®, Inc., an Epiphany™ based processor provided by Adapteva®, or the like. In some embodiments, the processor circuitry 1552 and/or acceleration circuitry 1564 and/or hardware accelerator circuitry may be implemented as AI accelerating co-processor(s), such as the Hexagon 685 DSP provided by Qualcomm®, the PowerVR 2NX Neural Net Accelerator (NNA) provided by Imagination Technologies Limited®, the Neural Engine core within the Apple® A11 or A12 Bionic SoC, the Neural Processing Unit (NPU) within the HiSilicon Kirin 970 provided by Huawei®, and/or the like. In some hardware-based implementations, individual subsystems of system 1550 may be operated by the respective AI accelerating co-processor(s), AI GPUs, TPUs, or hardware accelerators (e.g., FPGAs, ASICs, DSPs, SoCs, etc.), etc., that are configured with appropriate logic blocks, bit stream(s), etc. to perform their respective functions.

The system 1550 also includes system memory 1554. Any number of memory devices may be used to provide for a given amount of system memory. As examples, the memory 1554 may be, or include, volatile memory such as random access memory (RAM), static RAM (SRAM), dynamic RAM (DRAM), synchronous DRAM (SDRAM), RAM-BUS® Dynamic Random Access Memory (RDRAM®), and/or any other desired type of volatile memory device. Additionally or alternatively, the memory 1554 may be, or include, non-volatile memory such as read-only memory (ROM), erasable programmable ROM (EPROM), electrically erasable programmable (EEPROM), flash memory, non-volatile RAM, ferroelectric RAM, phase-change memory (PCM), flash memory, and/or any other desired type of non-volatile memory device. Access to the memory 1554 is controlled by a memory controller. The individual memory devices may be of any number of different package types such as single die package (SDP), dual die package (DDP) or quad die package (Q17P). Any number of other memory implementations may be used, such as dual inline memory modules (DIMMs) of different varieties including but not limited to microDIMMs or MiniDIMMs.

Storage circuitry 1558 provides persistent storage of information such as data, applications, operating systems and so forth. In an example, the storage 1558 may be implemented via a solid-state disk drive (SSDD) and/or high-speed electrically erasable memory (commonly referred to as "flash memory"). Other devices that may be used for the storage 1558 include flash memory cards, such as SD cards, microSD cards, XD picture cards, and the like, and USB flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, phase change RAM (PRAM), resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a Domain Wall (DW) and Spin Orbit Transfer (SOT) based device, a thyristor based memory device, a hard disk drive (HDD), micro HDD, of a combination thereof, and/or any other memory. The memory circuitry 1554 and/or storage circuitry 1558 may also incorporate three-dimensional (3D) cross-point (XPOINT) memories from Intel® and Micron®.

The memory circuitry 1554 and/or storage circuitry 1558 is/are configured to store computational logic 1583 in the form of software, firmware, microcode, or hardware-level instructions to implement the techniques described herein. The computational logic 1583 may be employed to store working copies and/or permanent copies of programming instructions, or data to create the programming instructions, for the operation of various components of system 1550 (e.g., drivers, libraries, application programming interfaces (APIs), etc.), an operating system of system 1550, one or more applications, and/or for carrying out the embodiments discussed herein. The computational logic 1583 may be stored or loaded into memory circuitry 1554 as instructions 1582, or data to create the instructions 1582, which are then accessed for execution by the processor circuitry 1552 to carry out the functions described herein. The processor circuitry 1552 and/or the acceleration circuitry 1564 accesses the memory circuitry 1554 and/or the storage circuitry 1558 over the interconnect (IX) 1556. The instructions 1582 direct the processor circuitry 1552 to perform a specific sequence or flow of actions, for example, as described with respect to flowchart(s) and block diagram(s) of operations and functionality depicted previously. The various elements may be implemented by assembler instructions supported by processor circuitry 1552 or high-level languages that may be compiled into instructions 1588, or data to create the instructions 1588, to be executed by the processor circuitry 1552. The permanent copy of the programming instructions may be placed into persistent storage devices of storage circuitry 1558 in the factory or in the field through, for example, a distribution medium (not shown), through a communication interface (e.g., from a distribution server (not shown)), over-the-air (OTA), or any combination thereof.

The IX 1556 couples the processor 1552 to communication circuitry 1566 for communications with other devices, such as a remote server (not shown) and the like. The communication circuitry 1566 is a hardware element, or collection of hardware elements, used to communicate over one or more networks 1563 and/or with other devices. In one example, communication circuitry 1566 is, or includes, transceiver circuitry configured to enable wireless communications using any number of frequencies and protocols such as, for example, the Institute of Electrical and Electronics Engineers (IEEE) 802.11 (and/or variants thereof), IEEE 802.23.4, Bluetooth® and/or Bluetooth® low energy (BLE), ZigBee®, LoRaWAN™ (Long Range Wide Area Network), a cellular protocol such as 3GPP LTE and/or Fifth Generation (5G)/New Radio (NR), and/or the like. Additionally or alternatively, communication circuitry 1566 is, or includes, one or more network interface controllers (NICs) to enable wired communication using, for example, an Ethernet connection, Controller Area Network (CAN), Local Interconnect Network (LIN), DeviceNet, ControlNet, Data Highway+, or PROFINET, among many others.

The IX 1556 also couples the processor 1552 to interface circuitry 1570 that is used to connect system 1550 with one or more external devices 1572. The external devices 1572 may include, for example, sensors, actuators, positioning circuitry (e.g., global navigation satellite system (GNSS)/Global Positioning System (GPS) circuitry), client devices, servers, network appliances (e.g., switches, hubs, routers, etc.), integrated photonics devices (e.g., optical neural network (ONN) integrated circuit (IC) and/or the like), and/or other like devices.

In some optional examples, various input/output (I/O) devices may be present within or connected to, the system 1550, which are referred to as input circuitry 1586 and output circuitry 1584. The input circuitry 1586 and output circuitry 1584 include one or more user interfaces designed to enable user interaction with the platform 1550 and/or peripheral component interfaces designed to enable peripheral component interaction with the platform 1550. Input circuitry 1586 may include any physical or virtual means for accepting an input including, inter alia, one or more physical or virtual buttons (e.g., a reset button), a physical keyboard, keypad, mouse, touchpad, touchscreen, microphones, scanner, headset, and/or the like. The output circuitry 1584 may be included to show information or otherwise convey information, such as sensor readings, actuator position(s), or other like information. Data and/or graphics may be displayed on one or more user interface components of the output circuitry 1584. Output circuitry 1584 may include any number and/or combinations of audio or visual display, including, inter alia, one or more simple visual outputs/indicators (e.g., binary status indicators (e.g., light emitting diodes (LEDs)) and multi-character visual outputs, or more complex outputs such as display devices or touchscreens (e.g., Liquid Crystal Displays (LCD), LED displays, quantum dot displays, projectors, etc.), with the output of characters, graphics, multimedia objects, and the like being generated or produced from the operation of the platform 1550. The output circuitry 1584 may also include speakers and/or other audio emitting devices, printer(s), and/or the like. Additionally or alternatively, sensor(s) may be used as the input circuitry 1584 (e.g., an image capture device, motion capture device, or the like) and one or more actuators may be used as the output device circuitry 1584 (e.g., an actuator to provide haptic feedback or the like). Peripheral component interfaces may include, but are not limited to, a non-volatile memory port, a USB port, an audio jack, a power supply interface, etc. In some embodiments, a display or console hardware, in the context of the present system, may be used to provide output and receive input of an edge computing system; to manage components or services of an edge computing system; identify a state of an edge computing component or service; or to conduct any other number of management or administration functions or service use cases.

The components of the system 1550 may communicate over the IX 1556. The IX 1556 may include any number of technologies, including ISA, extended ISA, I2C, SPI, point-to-point interfaces, power management bus (PMBus), PCI, PCIe, PCIx, Intel® UPI, Intel® Accelerator Link, Intel® CXL, CAPI, OpenCAPI, Intel® QPI, UPI, Intel® OPA IX, RapidIO™ system IXs, CCIX, Gen-Z Consortium IXs, a HyperTransport interconnect, NVLink provided by NVIDIA®, a Time-Trigger Protocol (TTP) system, a FlexRay system, PROFIBUS, and/or any number of other IX technologies. The IX 1556 may be a proprietary bus, for example, used in a SoC based system.

The number, capability, and/or capacity of the elements of system 1550 may vary, depending on whether computing system 1550 is used as a stationary computing device (e.g., a server computer in a data center, a workstation, a desktop computer, etc.) or a mobile computing device (e.g., a smartphone, tablet computing device, laptop computer, game console, IoT device, etc.). In various implementations, the computing device system 1550 may comprise one or more components of a data center, a desktop computer, a workstation, a laptop, a smartphone, a tablet, a digital camera, a smart appliance, a smart home hub, a network appliance, and/or any other device/system that processes data.

The techniques described herein can be performed partially or wholly by software or other instructions provided in a machine-readable storage medium (e.g., memory). The software is stored as processor-executable instructions (e.g., instructions to implement any other processes discussed herein). Instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions.

The storage medium can be a tangible machine readable medium such as read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs)), among others.

The storage medium may be included, e.g., in a communication device, a computing device, a network device, a personal digital assistant, a manufacturing tool, a mobile communication device, a cellular phone, a notebook computer, a tablet, a game console, a set top box, an embedded system, a TV (television), or a personal desktop computer.

Some non-limiting examples of various embodiments are presented below.

Example 1 includes an apparatus, comprising: a set of transmit lanes on a first chip; and a first finite state machine on the first chip, wherein the first finite state machine is coupled to the set of transmit lanes and is to test each transmit lane of the set of transmit lanes, one transmit lane at a time, wherein in the test of each transmit lane of the set of transmit lanes, the first finite state machine is to apply a first periodic signal to the transmit lane under test and concurrently apply a second periodic signal to other transmit lanes of the set of transmit lanes, and a phase of the first periodic signal is opposite to a phase of the second periodic signal.

Example 2 includes the apparatus of Example 1, wherein: the test of each transmit lane of the set of transmit lanes is part of a sort test of the first chip; and the first finite state machine comprises a first comparator to identify one or more defective transmit lanes in the set of transmit lanes, wherein to identify the one or more defective transmit lanes, the first comparator is to compare a signal detected on the transmit lane under test to an expected response, during the test of each transmit lane.

Example 3 includes the apparatus of Example 2, further comprising a set of branch lanes to couple the transmit lanes to the first comparator.

Example 4 includes the apparatus of Example 2 or 3, wherein the first finite state machine is to determine a repair signature based on the one or more defective transmit lanes, and the repair signature identifies one or more replacement transmit lanes of the set of transmit lanes for the one or more defective transmit lanes.

Example 5 includes the apparatus of any one of Examples 1-4, wherein each transmit lane of the set of transmit lanes is coupled to a respective micro bump of the first chip and each respective micro bump of the first chip is to attach to a respective micro bump of a second chip.

Example 6 includes the apparatus of any one of Examples 1-5, further comprising: a set of receive lanes on the first chip; and a second finite state machine on the first chip, wherein the second finite state machine is coupled to the set of receive lanes and is to test each receive lane of the set of receive lanes, one receive lane at a time, wherein in the test of each receive lane of the set of receive lanes, the second finite state machine is to apply a third periodic signal to the receive lane under test and concurrently apply a fourth periodic signal to other receive lanes of the set of receive lanes, where a phase of the third periodic signal is opposite to a phase of the fourth periodic signal, and to compare a signal detected on the receive lane under test to an expected response.

Example 7 includes the apparatus of Example 6, wherein: the second finite state machine is to identify one or more defective receive lanes in the set of receive lanes and to determine a repair signature based on the one or more defective receive lanes; and the repair signature identifies one or more replacement receive lanes of the set of receive lanes for the one or more defective receive lanes.

Example 8 includes the apparatus of Example 6 or 7, wherein: each receive lane of the set of receive lanes is coupled to a respective micro bump of the first chip; each receive lane of the set of receive lanes comprises a respective active-low inverting tristate buffer in series with an inverting buffer; and in the test of each receive lane of the set of receive lanes, the second finite state machine is to set an enable control line of the respective active-low inverting tristate buffer to a high level to electrically disconnect the receive lane under test from the respective micro bump.

Example 9 includes the apparatus of any one of Examples 1-8, further comprising: a set of receive lanes on the first chip, each receive lane of the set of receive lanes is coupled to a respective micro bump of the first chip; and a second finite state machine on the first chip, wherein the second finite state machine is coupled to the set of receive lanes and is to test each receive lane of the set of receive lanes, one receive lane at a time, wherein in the test of each receive lane of the set of receive lanes, the second finite state machine is to compare a signal detected on the receive lane under test to an expected response, and the signal detected is received on the receive lane under test from a second chip via one of the respective micro bumps if there is no fault affecting the receive lane under test.

Example 10 includes the apparatus of Example 9, wherein: each receive lane of the set of receive lanes comprises a respective active-low inverting tristate buffer in series with an inverting buffer; and in the test of each receive lane of the set of receive lanes, the second finite state machine is to set an enable control line of the respective active-low inverting tristate buffer to a low level to electrically connect the receive lane under test to the respective micro bump.

Example 11 includes the apparatus of any one of Examples 1-10, further comprising: first and second clock lanes to carry a clock signal; a clock monitor to determine whether the clock signal on the first clock lane is defective; and a multiplexer, responsive to the clock monitor, to select the clock signal on the first clock lane if the clock signal on the first clock lane is not defective, and the clock signal on the second clock lane if the clock signal on the first clock lane is defective.

Example 12 includes the apparatus, comprising: a set of receive lanes on a first chip; a set of interconnects on the first chip, wherein each receive lane of the set of receive lanes is connected to a respective interconnect of the set of interconnects, and the set of interconnects of the first chip are to connect to a second chip; a signal generator on the first chip; for each receive lane of the set of receive lanes, a respective switch on the first chip; and a comparator on the first chip, wherein in a test of each receive lane of the set of receive lanes which does not involve the second chip, the respective switches are turned off, and to test each receive lane of the set of receive lanes, one receive lane at a time, the signal generator is to apply a first periodic signal to the receive lane under test and concurrently apply a second periodic signal to other receive lanes of the set of receive lanes, and the comparator is to determine whether a time-shifted version of the first periodic signal is detected on the receive lane under test.

Example 13 includes the apparatus of Example 12, wherein a phase of the first periodic signal is opposite to a phase of the second periodic signal.

Example 14 includes the apparatus of Example 12 or 13, wherein: in a test of each receive lane of the set of receive lanes which involves the second chip, the respective switches are turned on, and to test each receive lane of the set of receive lanes, one receive lane at a time, the comparator is to determine whether a time-shifted version of a third periodic signal is received on the receive lane under test from the second chip via one of the respective interconnects.

Example 15 includes the apparatus of Example 14, further comprising: an error analyzer coupled to the comparator, the error analyzer is to provide a repair signature which identifies one or more replacement lanes for one or more defective lanes in response to the test of each lane of the set of lanes which does not involve the second chip and in response to the test of each lane of the set of lanes which does involve the second chip.

Example 16 includes an apparatus, comprising: a set of transmit lanes on a first chip; a set of interconnects on the first chip, wherein each lane of the set of transmit lanes is connected to a respective interconnect of the set of interconnects on the first chip; a set of receive lanes on a second chip; a set of interconnects on the second chip, wherein each lane of the set of receive lanes is connected to a respective interconnect of the set of interconnects on the second chip; a signal generator on the first chip; and a comparator on the second chip; wherein the signal generator, to test each transmit lane of the set of transmit lanes, is to apply a first periodic signal to the transmit lane under test and to apply a second period signal to other lanes of the set of transmit lanes, while the comparator is to determine whether a time-shifted version of the first periodic signal is received on a corresponding receive lane of the set of receive lanes.

Example 17 includes the apparatus of Example 16, wherein a phase of the first periodic signal is opposite to a phase of the second periodic signal.

Example 18 includes the apparatus of Example 16 or 17, wherein: the set of interconnects on the first chip comprise micro bumps; the set of interconnects on the second chip comprise micro bumps; the second chip is arranged vertically above the first chip; and each respective micro bump of the second chip is to connect to a respective micro bump of the first chip.

Example 19 includes the apparatus of any one of Examples 16-18, wherein: the first chip is separated from the second chip by an intermediate chip; and each respective interconnect of the set of interconnects on the second chip is to connect to a respective interconnect of the set of interconnects on the first chip through a through-silicon via in the intermediate chip.

Example 20 includes the apparatus of Example 19, wherein: the set of interconnects on the first chip comprise micro bumps which are to connect to the through-silicon vias of the intermediate chip; and the set of interconnects on the second chip comprise hybrid bonding interconnects which are to connect to the through-silicon vias of the intermediate chip.

In the present detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The terms "coupled," "communicatively coupled," along with derivatives thereof are used herein. The term "coupled" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or link, and/or the like.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
a set of transmit lanes on a first chip;
a first finite state machine on the first chip, wherein the first finite state machine is coupled to the set of transmit lanes and is to test each transmit lane of the set of transmit lanes, one transmit lane at a time, wherein in the test of each transmit lane of the set of transmit lanes, the first finite state machine is to apply a first periodic signal to the transmit lane under test and concurrently apply a second periodic signal to other transmit lanes of the set of transmit lanes, and a phase of the first periodic signal is opposite to a phase of the second periodic signal;
a set of receive lanes on the first chip; and
a second finite state machine on the first chip, wherein the second finite state machine is coupled to the set of receive lanes and is to test each receive lane of the set of receive lanes, one receive lane at a time, wherein in the test of each receive lane of the set of receive lanes, the second finite state machine is to apply a third periodic signal to the receive lane under test and concurrently apply a fourth periodic signal to other receive lanes of the set of receive lanes, where a phase of the third periodic signal is opposite to a phase of the fourth periodic signal, and to compare a signal detected on the receive lane under test to an expected response.

2. The apparatus of claim 1, wherein:
the test of each transmit lane of the set of transmit lanes is part of a sort test of the first chip; and
the first finite state machine comprises a first comparator to identify one or more defective transmit lanes in the set of transmit lanes, wherein to identify the one or more defective transmit lanes, the first comparator is to compare a signal detected on the transmit lane under test to an expected response, during the test of each transmit lane.

3. The apparatus of claim 2, further comprising a set of branch lanes to couple the transmit lanes to the first comparator.

4. The apparatus of claim 2, wherein the first finite state machine is to determine a repair signature based on the one or more defective transmit lanes, and the repair signature identifies one or more replacement transmit lanes of the set of transmit lanes for the one or more defective transmit lanes.

5. The apparatus of claim 1, wherein each transmit lane of the set of transmit lanes is coupled to a respective micro bump of the first chip and each respective micro bump of the first chip is to attach to a respective micro bump of a second chip.

6. The apparatus of claim 1, wherein:
the second finite state machine is to identify one or more defective receive lanes in the set of receive lanes and to determine a repair signature based on the one or more defective receive lanes; and
the repair signature identifies one or more replacement receive lanes of the set of receive lanes for the one or more defective receive lanes.

7. The apparatus of claim 1, wherein:
each receive lane of the set of receive lanes is coupled to a respective micro bump of the first chip;
each receive lane of the set of receive lanes comprises a respective active-low inverting tristate buffer in series with an inverting buffer; and
in the test of each receive lane of the set of receive lanes, the second finite state machine is to set an enable control line of the respective active-low inverting tristate buffer to a high level to electrically disconnect the receive lane under test from the respective micro bump.

8. The apparatus of claim 1, wherein:
each receive lane of the set of receive lanes is coupled to a respective micro bump of the first chip; and
in the test of each receive lane of the set of receive lanes, the second finite state machine is to compare a signal detected on the receive lane under test to an expected response, and the signal detected is received on the receive lane under test from a second chip via one of the respective micro bumps if there is no fault affecting the receive lane under test.

9. The apparatus of claim 8, wherein:
each receive lane of the set of receive lanes comprises a respective active-low inverting tristate buffer in series with an inverting buffer; and
in the test of each receive lane of the set of receive lanes, the second finite state machine is to set an enable control line of the respective active-low inverting tristate buffer to a low level to electrically connect the receive lane under test to the respective micro bump.

10. The apparatus of claim 1, further comprising:
first and second clock lanes to carry a clock signal;
a clock monitor to determine whether the clock signal on the first clock lane is defective; and a multiplexer, responsive to the clock monitor, to select the clock signal on the first clock lane if the clock signal on the first clock lane is not defective, and the clock signal on the second clock lane if the clock signal on the first clock lane is defective.

11. An apparatus, comprising:

a set of receive lanes on a first chip;

a set of interconnects on the first chip, wherein each receive lane of the set of receive lanes is connected to a respective interconnect of the set of interconnects, and the set of interconnects of the first chip are to connect to a second chip;

a signal generator on the first chip;

for each receive lane of the set of receive lanes, a respective switch on the first chip;

a comparator on the first chip, wherein in a test of each receive lane of the set of receive lanes which does not involve the second chip, the respective switches are turned off, and to test each receive lane of the set of receive lanes, one receive lane at a time, the signal generator is to apply a first periodic signal to the receive lane under test and concurrently apply a second periodic signal to other receive lanes of the set of receive lanes, and the comparator is to determine whether a time-shifted version of the first periodic signal is detected on the receive lane under test, wherein in a test of each receive lane of the set of receive lanes which involves the second chip, the respective switches are turned on, and to test each receive lane of the set of receive lanes, one receive lane at a time, the comparator is to determine whether a time-shifted version of a third periodic signal is received on the receive lane under test from the second chip via one of the respective interconnects; and an error analyzer coupled to the comparator, the error analyzer is to provide a repair signature which identifies one or more replacement lanes for one or more defective lanes in response to the test of each lane of the set of lanes which does not involve the second chip and in response to the test of each lane of the set of lanes which does involve the second chip.

12. The apparatus of claim 11, wherein a phase of the first periodic signal is opposite to a phase of the second periodic signal.

13. An apparatus, comprising:

a set of transmit lanes on a first chip;

a set of interconnects on the first chip, wherein each lane of the set of transmit lanes is connected to a respective interconnect of the set of interconnects on the first chip;

a set of receive lanes on a second chip;

a set of interconnects on the second chip, wherein each lane of the set of receive lanes is connected to a respective interconnect of the set of interconnects on the second chip;

a signal generator on the first chip; and a comparator on the second chip;

wherein the signal generator, to test each transmit lane of the set of transmit lanes, is to apply a first periodic signal to the transmit lane under test and to apply a second period signal to other lanes of the set of transmit lanes, while the comparator is to determine whether a time-shifted version of the first periodic signal is received on a corresponding receive lane of the set of receive lanes.

14. The apparatus of claim 13, wherein a phase of the first periodic signal is opposite to a phase of the second periodic signal.

15. The apparatus of claim 13, wherein:

the set of interconnects on the first chip comprise micro bumps;

the set of interconnects on the second chip comprise micro bumps;

the second chip is arranged vertically above the first chip; and each respective micro bump of the second chip is to connect to a respective micro bump of the first chip.

16. The apparatus of claim 13, wherein:

the first chip is separated from the second chip by an intermediate chip; and each respective interconnect of the set of interconnects on the second chip is to connect to a respective interconnect of the set of interconnects on the first chip through a through-silicon via in the intermediate chip.

17. The apparatus of claim 16, wherein:

the set of interconnects on the first chip comprise micro bumps which are to connect to the through-silicon vias of the intermediate chip; and the set of interconnects on the second chip comprise hybrid bonding interconnects which are to connect to the through-silicon vias of the intermediate chip.

* * * * *